(12) United States Patent
Grange et al.

(10) Patent No.: US 6,404,823 B1
(45) Date of Patent: Jun. 11, 2002

(54) ENVELOPE FEEDFORWARD TECHNIQUE WITH POWER CONTROL FOR EFFICIENT LINEAR RF POWER AMPLIFICATION

(75) Inventors: Robert Edmund Grange; Donald Brian Eidson, both of San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/108,628

(22) Filed: Jul. 1, 1998

(51) Int. Cl.[7] .......................... H04K 1/02; H04L 25/03; H04L 25/49
(52) U.S. Cl. .......................................... 375/297; 330/10
(58) Field of Search ............................... 330/10, 207 R, 330/278, 127, 149, 151; 375/297, 325, 340

(56) References Cited

U.S. PATENT DOCUMENTS

| | | | |
|---|---|---|---|
| 4,194,154 A | * | 3/1980 | Kahn |
| 4,632,124 A | * | 12/1986 | Hiller et al. |
| 5,491,457 A | * | 2/1996 | Feher ........................ 332/103 |
| 5,524,120 A | * | 6/1996 | Pride, III et al. .......... 375/225 |
| 5,694,433 A | * | 12/1997 | Dent .......................... 375/297 |
| 5,784,402 A | * | 7/1998 | Feher ......................... 375/130 |

* cited by examiner

Primary Examiner—Jean Corrirlius
(74) Attorney, Agent, or Firm—Knobbe, Martens, Olson & Bear LLP

(57) ABSTRACT

An envelope feedforward technique is described that provides efficient, variable-power, linear amplification of an input signal. An input signal having phase and amplitude components is separated (decomposed) into an FM portion and an envelope portion. The FM portion contains the high frequency phase and frequency information from the input signal. The envelope portion contains the low frequency amplitude information from the input signal. An envelope combiner uses the envelope signal to amplitude-modulate the FM signal to produce an output signal. Spectral regrowth of the output signal is reduced by adjusting the relative time delays in the signal path of the envelope signal and the FM signal such that the FM signal and the envelope signal arrive at the envelope combiner at the same time. The envelope feedforward technique may be used to increase battery life in a handheld mobile RF unit such as a cellular telephone. An efficient Class D switching amplifier is constructed using a dual-gate FET by applying the envelope signal to the first gate to vary the transconductance of the FET and by applying the FM signal to the second gate to switch the FET on and off.

37 Claims, 14 Drawing Sheets

ENVELOPE FEEDFORWARD TECHNIQUE WITH POWER CONTROL FOR EFFICIENT LINEAR RF POWER AMPLIFICATION

BACKGROUND OF THE INVENTION

1. Field of the Invention

The disclosed invention relates to efficient power amplifiers and more particularly to efficient RF power amplifiers.

2. Description of the Related Art

Radio Frequency (RF) transmitters, such as cellular telephones, use an RF Power Amplifier (PA) to provide the RF signal strength needed for radio communications over a distance. The output of the PA is typically provided to a transmitting antenna, and thus the power output of the PA is proportional to the transmitted power. As the output power of the PA increases, the power radiated by the transmitting antenna increases and the useable range of the transmitter increases.

In most RF transmitters, the PA handles the largest power within the transmitter and inefficiency in the PA typically accounts for much of the wasted power in the transmitter. Unfortunately, in many applications, the PA does not perform the task of power amplification efficiently, consuming much more power than is actually transmitted. This excess power generation can be costly, especially in battery operated devices, because it often necessitates the use of larger-capacity batteries, and/or shorter battery recharging intervals.

A PA may be designed to amplify an RF signal with a constant envelope or an RF signal with a non-constant envelope. A PA designed for constant envelope signals is typically more efficient than a PA designed for a non-constant envelope signal because the biasing circuits in the constant envelope PA can be optimized to deliver the constant power level. Moreover, if perfect envelope magnitude fidelity is not required, the PA circuits can be driven slightly into compression (nonlinearity), which offers even further efficiency gains. Unfortunately, as the PA is driven into compression, the signal spectrum tends to widen, due to nonlinear distortions. These nonlinear distortions produce intermodulation products, which arise when signals of differing frequencies pass through a nonlinearity. This spectral widening is called spectral regrowth, and is undesirable because it spills RF energy into adjacent frequency channels. The energy spilled into other channels is known as Adjacent Channel Power (ACP) emissions and is often undesirable because it may cause interference with communication systems operating in the other channels. Thus, tradeoffs exist between efficiency and ACP emissions, even for constant-envelope PAs. Typically, regulations on RF transmitters and communication systems specify an acceptable Adjacent Channel Power Ratio (ACPR). The ACPR is the ratio of the average power in the active channel passband to the average power spilled into an adjacent channel passband or some fraction of the adjacent channel passband.

Non-constant envelope signals, such as π/4 DQPSK (Differential Quadrature Phase Shift Keying) and spread spectrum signals, make the PA efficiency problem even more difficult because the modulation may cause the amplitude of the envelope to vary by 14 dB or more. Moreover, the peak-to-average power values may run from 3 dB, as in π/4 DQPSK, to 17 dB for some CDMA systems. Peak-to-average power is important because clipping occurs when the peak-power capabilities of the PA are exceeded, and clipping introduces much distortion. Most systems are biased so that the PA runs at near saturation when the amplitude of the envelope is at a maximum, corresponding to peak power output. To become even more efficient, some systems push the peak power output into saturation, but this can result in unacceptable ACP emissions. This push into saturation can also cause distortions in the in-band modulation accuracy, which is called EVM (error-vector modulation) accuracy, and is specified in terms of RMS error from an ideally modulated signal. To realize good ACP and EVM figures, transmitters that drive the PA into saturation often pre-distort those sections of the input envelope which would be compressed during saturation, so that the resulting output is an undistorted facsimile of the input. Unfortunately, most saturation regions are narrow (often less than the 3 dB peak-to-average criterion given above for π/4 DQPSK), and thus only allow modest pre-distortion (and efficiency) improvements.

Prior art PA designs are particularly inefficient when operating at less than full output power, as is common in systems that use adaptive power control. With adaptive power control the system controls the output power of the PA such that the PA provides only as much output power as is needed to provide good communications. Adaptive power control is useful because it extends battery life, by transmitting with no more power than needed, and, at the same time, increases a communication system's capacity, by reducing the interference among users. However, many of the desired gains promised by adaptive power control have not been realized because the power saved by transmitting at reduced power is lost because the PA is less efficient at reduced power. In one prior implementation, a typical prior art PHS (Personal Handy phone System) transmitter is typically 25% efficient at full power but only 3% efficient at a nominal power reduction of 10 dB. Similar performances have been observed for other modulation schemes and communication systems.

SUMMARY

The present invention solves these and other problems by providing an envelope feedforward PA design that improves the efficiency of a PA. Efficient operation is provided for signals with a non-constant, as well as constant, envelope. Efficient operation is also provided when operating the PA at reduced power levels. The PA may advantageously be used with many wireless communications systems because power control and high efficiency are universally desired features in subscriber units, as well as base stations. Even though battery life is not generally a problem in a base station, base stations benefit from a more efficient PA because the PA can be made relatively smaller, and the PA can be connected to circuits with lower power delivery ratings.

Virtually all communication systems employing a non-constant envelope modulation scheme, including, for example Personal Handy System (PHS) telephones, CDMA and spread spectrum telephones such as the Rockwell Spread Spectrum Telephone (SST), IS-95 [Electronic Industries Association/Telecommunications Industry Association; 1993] telephones, IS-136 telephones, and Personal Digital Cellular (PDC) telephones will benefit from the envelope feedforward PA. In one embodiment, the envelope feedforward PA is advantageously applied to PHS transmitters to increase PA efficiency to 70% or more.

Even communications standards employing constant envelope modulation schemes, such as Advanced Mobile Phone Service (AMPS), Global System for Mobile Communications (GSM), and Digital European Cordless Telephone (DECT) systems benefit from the power control feature provided by the envelope feedforward PA. The envelope feedforward transmitter is also useful with wideband systems such as CDMA and spread spectrum systems (e.g., IS-95, etc.).

In another embodiment, the feedforward transmitter provides higher efficiency over a range of nominal power output settings. Higher efficiency over a range of power output settings is desirable to support adaptive power control.

In one embodiment, an input signal having phase and amplitude components is separated (decomposed) into a phase and frequency modulated (FM) portion and an envelope portion. The FM portion has a constant envelope (no amplitude modulation) and contains the phase and frequency information from the input signal. The envelope portion contains the amplitude information from the input signal. In a multistage amplifier, the FM portion is amplified by a first amplifier to produce an amplified FM signal, and the envelope portion is optionally amplified by a second amplifier. In some embodiments, "amplification" of the envelope portion may be accomplished by adjusting the reference voltage in a digital-to-analog converter. The envelope signal is combined with the amplified FM signal by an envelope combiner to produce a combined signal having FM and amplitude components. The envelope combiner uses the envelope signal to amplitude-modulate the FM signal to produce the combined signal.

The feedforward PA also provides precise and efficient power control to allow the transmitter to be operated at reduced power levels without sacrificing efficiency. Over a certain range of power outputs, adjusting the nominal (average) power at the PA output is accomplished by level shifting the envelope component. One method of accomplishing this is by intelligently changing the output range of the DAC (Digital-to-Analog Converter) responsible for the envelope component at baseband. Alternatively, a bias voltage associated with the envelope control input is adjusted. One skilled in the art will recognize that a combination of the above techniques may be used.

In one embodiment, the envelope combiner uses a gain-controlled amplifier having a signal input and a control input. The gain of the gain-controlled amplifier is a function of a signal provided to the control input. The amplified FM signal is provided to the signal input and the amplified envelope signal is provided to the control input. An output of the gain-controlled amplifier is the combined signal.

In another embodiment, the envelope combiner uses a mixer with conversion gain to combine the amplified FM signal and the amplified envelope signal. The amplified FM signal is provided to one input of the mixer and the amplified envelope signal is provided to another input of the mixer. An output of the mixer is provided to a filter, and an output of the filter is a combined signal.

In yet another embodiment, the envelope combiner uses a voltage-controlled switch in combination with a variable gain element to combine the FM signal and the envelope signal. The FM signal is provided to a control input of the switch. The amplified envelope signal is used to alter the transconductance of a variable gain element, such as a FET operating in its linear (saturation) region. The envelope is superimposed on the FM signal by altering the gain of the variable gain element. In one embodiment, the combination of a voltage-controlled switch and a variable gain element is provided by a dual gate FET.

In one embodiment, the relative time delays in the signal path of the envelope signal and the FM signal are matched such that the amplified non-constant signal and the amplified FM signal arrive at the envelope combiner at the same time. The delay in the envelope signal path is tuned to the delay in the FM signal path. Proper adjustment of the relative time delay in the two paths reduces spectral regrowth associated with the constant envelope signal input. Real-time adjustment of the delay (tuning) is typically not needed. However, real-time adjustment of the delay may be advantageously provided for transmitters that are not sufficiently stable over time and temperature. Temperature sensors and a control algorithm are used to adjust the delay timing.

In one embodiment, an input signal having FM and envelope components is produced by an encoder that produces a modulated signal represented by an I channel output and Q a channel output. The modulated signal is separated (decomposed) into an FM portion and an envelope portion by using a lookup table having cells arranged as rows and columns. A cell is selected (addressed) by using I channel and Q channel values ad row and column addresses. Each cell in the lookup table provides data corresponding to the envelope signal, the I portion of the FM signal (IC), and the Q portion of the FM signal (QC). In one embodiment, the IC and QC portions are combined by a quadrature mixer to produce the FM signal.

In one embodiment, an input signal is separated into a first signal and a second signal, the second signal having an envelope amplitude maximum and an envelope amplitude minimum. The first signal is modified to produce a first modified signal, the first modified signal being delayed by a first propagation delay. The second signal is modified to produce a second modified signal, the second modified signal being delayed by a second propagation delay. The first modified signal and said second modified signal are combined to produce an output signal. The lesser of the first propagation delay and the second propagation delay are adjusted to reduce spectral regrowth of the output signal. In one embodiment, an absolute value of a difference between the first propagation delay and the second propagation delay is less than one microsecond. In one embodiment, an absolute value of a difference between the first propagation delay and the second propagation delay is less than one tenth of a time bandwidth of the input signal. In one embodiment, the propagation delay adjustment includes increasing said lesser of said first propagation delay and said second propagation delay.

In one embodiment,. the envelope minimum is not less than 75% of the envelope maximum

BRIEF DESCRIPTION OF THE DRAWINGS

The advantages and features of the disclosed invention will readily be appreciated by persons skilled in the art from the following detailed description when read in conjunction with the drawings listed below.

Figure 1A:
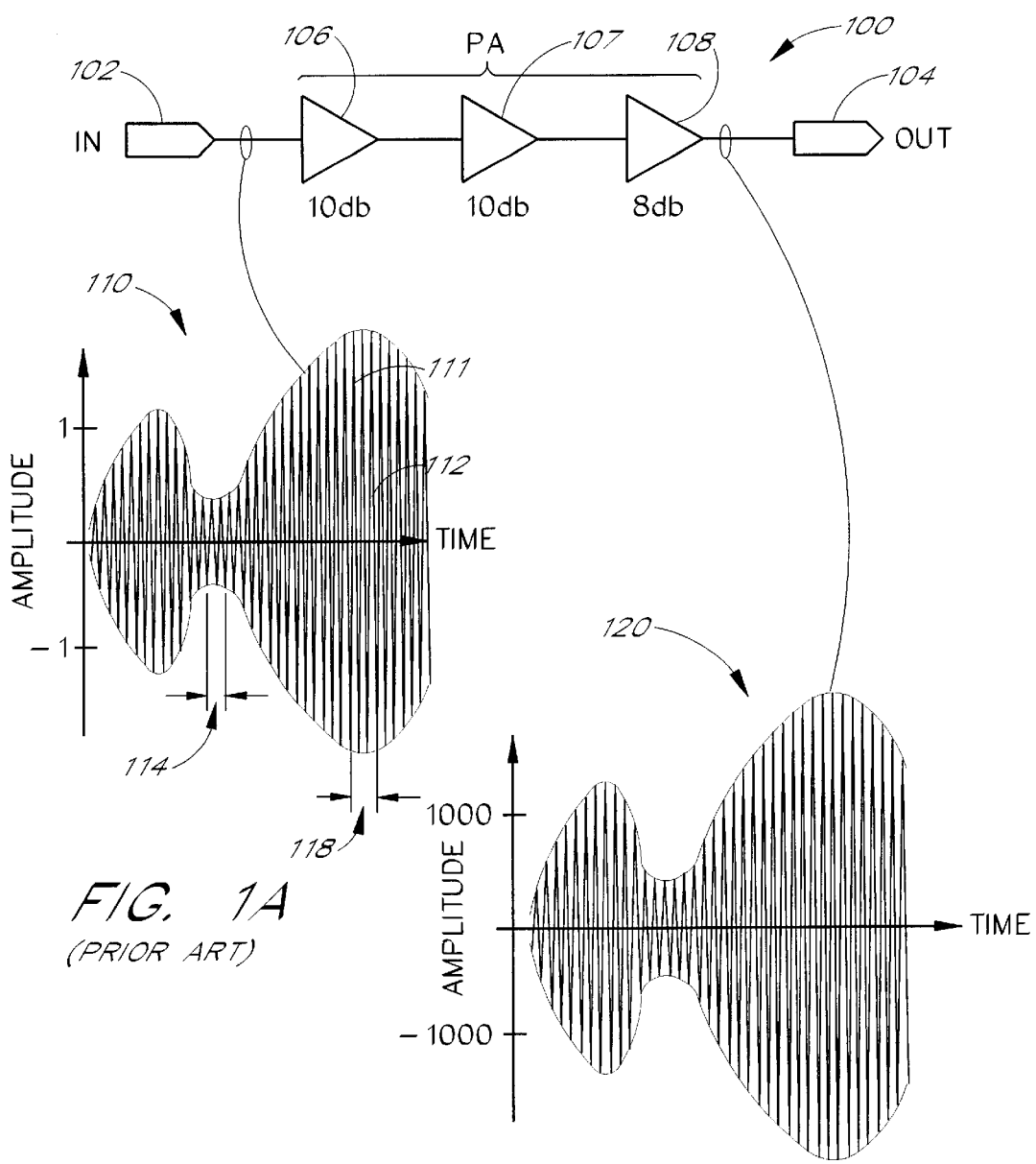
FIG. 1A is a block diagram of prior art PA showing an input signal, several gain stages, and an output signal.

In the drawings, the first digit of any three-digit number generally indicates the number of the figure in which the element first appears. Where four-digit reference numbers are used, the first two digits indicate the figure number.

DETAILED DESCRIPTION

FIG. 1A is a block diagram of a typical prior art Radio Frequency (RF) Power Amplifier (PA) 100 having an input 102 and an output 104. The input 102 is provided to an input of a first gain stage 106. An output of the first gain stage 106 is provided to an input of a second gain stage 107. An output of the second gain stage 107 is provided to an input of a third gain stage 108 and an output of the third gain stage 108 is provided to the output 104. The first and second gain stages 106 and 107 are shown as having a gain of 10 dB each, and the gain stage 108 is shown as having a gain of 8 dB.

Figure 1B:
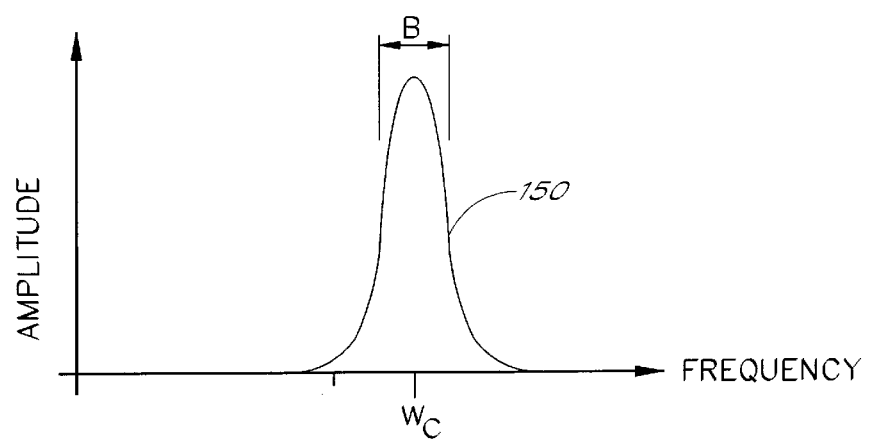
FIG. 1B is a frequency-domain representation of the spectrum of the input and output signals shown in FIG. 1A.

A time domain plot 110 shows a typical input signal provided to the input 102 and a time-domain plot 120 shows a typical output signal provided by the output 104. The plot 110 shows the input signal as a curve 112 having an envelope 111. The amplitude of the envelope 111 varies with time, having a relatively low amplitude region 114 and a relatively high amplitude region 118. As illustrated, the amplitude envelope has an envelope amplitude minimum and an envelope amplitude maximum. The plot 120 shows the output signal and its envelope as being very similar to the curve 112 and envelope 111 respectively, except that the amplitudes in the plot 120 are much larger owing to the amplification provided by the gain stages 106–108. FIG. 1B is a frequency-domain representation of the spectrum of the input and output signals shown in FIG. 1A. The spectrum shown in FIG. 1B shows a bandwidth B and a center frequency $\omega_c$.

FIG. 1A shows three gain stages because typical solid state amplifier cannot produce enough power gain in a single stage. If the signal at the input 102 has an average power level of −10 dBm (where dBm is the power in decibels referenced to one milliwatt), then the output of the first gain stage 106 will have an average power level of 0 dBm, the output of the second gain stage 107 will have an average power level of 10 dBm, and the output of the third gain stage 108 will have an average power level of 18 dBm (74.0 milliwatts). Thus, the total power amplification provided by the PA 100 is 28 dB.

However, just because each gain stage provides approximately the same gain does not mean that each stage is operating at the same power level. Each successive gain stage operates at a higher power level than the previous gain stage. In the above example, the first stage 106 can be designed to operate at a maximum output power level of just over 0 dBm without distorting the signal being amplified. Thus, even if the first gain stage 106 is only 50% efficient at full power (e.g. a Class A amplifier), the total power dissipated by the first gain stage 106 is only about 0 dBm (1.0 milliwatts). The second stage can be designed to operate at a maximum output power level 10 dBm. Continuing with the same assumption of 50% efficiency, the power dissipated by the second gain stage 107 is approximately 10.0 milliwatts. Finally, the third gain stage 108 can be designed to operate at a maximum output power level of approximately 18 dBm, corresponding to a power dissipation of approximately 63.0 milliwatts. Thus, the total power dissipated by the PA 100 is approximately 74.0 milliwatts (1.0+10.0+63.0), corresponding to an overall efficiency of 50%.

The above analysis shows that the greatest potential for improving the efficiency of the PA 100 lies in improving the efficiency of the third gain stage 108. Even if the efficiency of the first two stages could be increased to 100%, the total power dissipation would still be 63 milliwatts, corresponding to an overall efficiency of 54%.

The efficiency of the gain stages 106–108 is determined largely by the mode (or class) in which the gain stages operate. Class A amplifiers are know to have a theoretical maximum efficiency of 50%, and this maximum efficiency is achieved only when operating at full output power. Class A amplifiers are less efficient when operating at lower power levels. A pure sine wave can drive a Class A amplifier at full power continuously. A more common signal, such as a music signal or human voice signal, will typically drive a Class A amplifier to full power during some time periods and less than full power during other time periods such that the overall efficiency is typically closer to 25%. The Class A amplifier is least efficient when operating in the quiescent (idle) state wherein the output power is zero. In the quiescent state, the efficiency of the Class A amplifier is 0% and the Class A amplifier dissipates twice its maximum output power level as heat. Thus, in the above example, the third gain stage dissipates approximately 126.0 milliwatts in the quiescent state.

Other amplifiers, such as Class AB, Class D, etc., which provide higher efficiencies are known in the art. Class AB amplifiers are commonly used in audio power amplifiers and can provide a theoretical maximum efficiency of approximately 75% (when operated in Class B mode) and, perhaps more importantly, dissipate very little power in the quiescent state. Class D amplifiers provide a theoretical maximum efficiency of 100% and dissipate very little power in the quiescent state. Other types of amplifiers are known as well. However, due to the characteristics of solid-state devices, solid-state RF power amplifiers, especially amplifiers that operate at 0.5 GHz and higher, are typically based on Class A or Class AB designs for non-constant envelope modulation schemes.

The maximum output power that can be delivered by a Class A amplifiers is largely determined by the power supply voltage provided to the amplifier, the output impedance of the amplifier, and the characteristics of the active devices (e.g. transistors, FETs, etc.) used in the amplifier. Reducing the power supply voltage provided to a Class A amplifier will reduce the maximum output power that the amplifier can produce, and thus will also reduce the power dissipated by the amplifier. However, reducing the power supply voltage does not make the amplifier more efficient. Moreover, the theoretical 50% efficiency of a Class A amplifier is not achieved in a solid state RF power amplifiers (PA), again because of characteristics of solid state devices. A typical low distortion RF PA with a Class A input stage and a Class AB output stage has an efficiency closer to 25–28% at full power and 3% when operating at 10 dB below full power.

Since a Class A RF PA operates more efficiently at full power, it would seem prudent to design RF communications systems to use modulation schemes that provided a modulated signal with a constant envelope so that the PA could operate at full power (peak efficiency at all times). For example, the curve 112 shown in FIG. 1A corresponds to a modulation scheme that does not provide a constant envelope, as shown by the envelope 111. Modulation schemes that do produce a constant envelope (e.g., an envelope such that the curve 111 is a horizontal line) are known, including, for example, Frequency Shift Keying (FSK), Minimum Shift Keying (MSK), Gaussian Minimum-Shift Keying (GMSK), Frequency Modulation (FM), and Tamed-FM. Unfortunately, such modulation schemes use more bandwidth than many of the modulation schemes that produce a non-constant envelope. If the constant envelope is viewed as a constraint on the modulated signal, then it can be said that the constant envelope modulation schemes use more bandwidth because the constant envelope signal is constrained in one dimension as compared to (i.e., has fewer degrees of freedom than) the non-constant envelope (unconstrained) scheme. The constant amplitude modulator overcomes the constraint on amplitude by using more bandwidth. The spectrum 150 shown in FIG. 1B shows a bandwidth B corresponding to the frequency bandwidth of the curve 112. If the curve 112 were re-modulated using a modulation scheme that provided a constant envelope 111, then the value of B shown in FIG. 1B would increase. Increasing the bandwidth B for a communication channel is undesirable because it limits the number of channels that can be provided within a given frequency band. Thus, communications systems designers, such as the designers of cellular telephone systems, are often forced to balance transmitter efficiency (and thus battery life) against the number of channels that can be provided.

Figure 2:
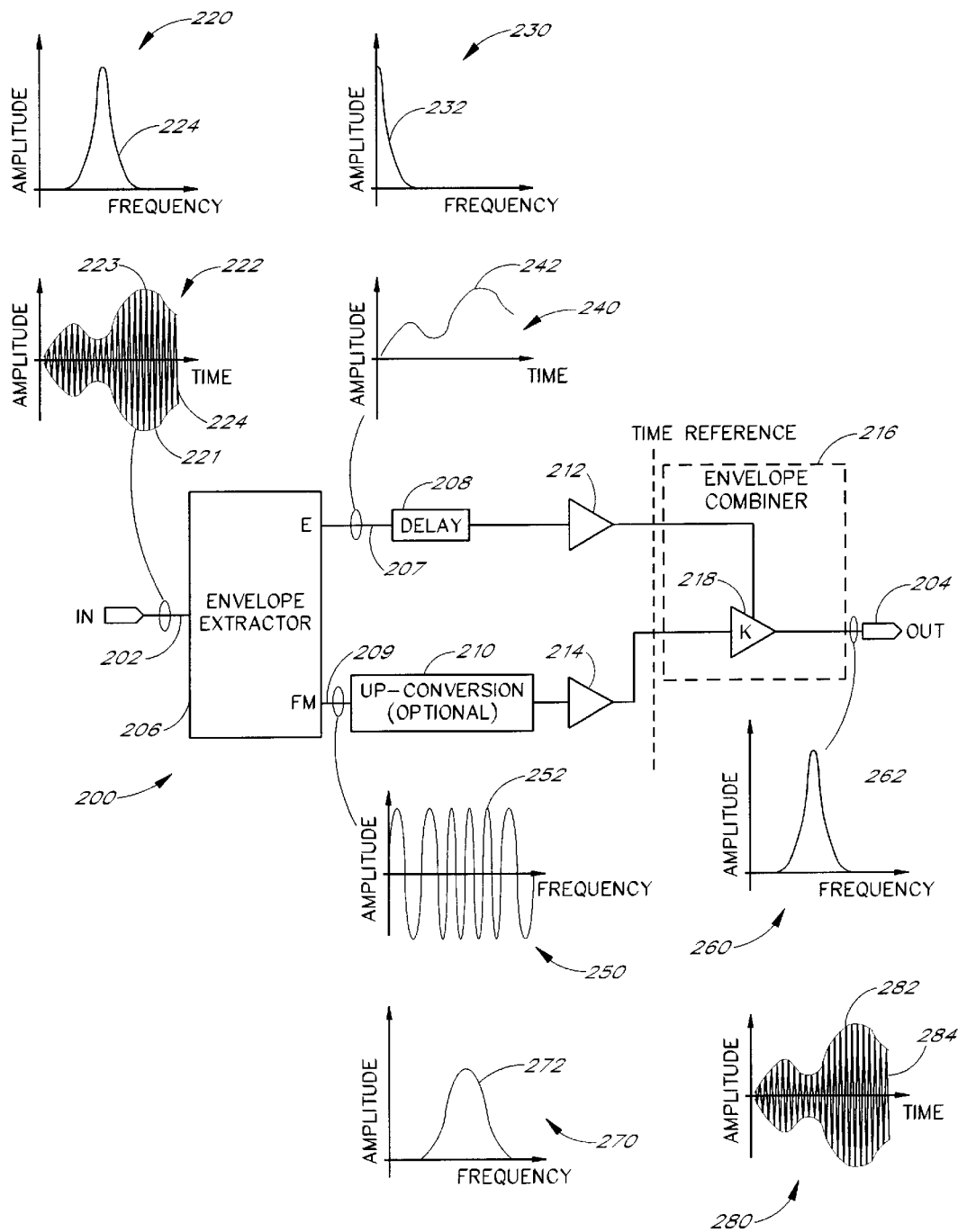
FIG. 2 is a block diagram of an envelope feedforward PA in accordance with one aspect of the present invention, that uses an envelope combiner to combine an envelope signal with an FM signal.

FIG. 2 is a block diagram of a feedforward PA 200, in accordance with one aspect of the present invention, that simultaneously provides some of the efficiency of constant envelope modulation and the system benefits of non-constant envelope modulation. In FIG. 2, an input signal 202, having a non-constant envelope, is provided to an input of an envelope extractor 206. The envelope extractor 206 decomposes the input signal 202 into two signals: an envelope signal having a non-constant envelope, and an FM signal having a constant envelope. In one embodiment, an AM (Amplitude Modulation) detector is used to extract the envelope signal, and an FM detector is used to extract the FM signal. The envelope signal carries the envelope (AM) portion of the input signal 202, and the FM signal carries the phase and frequency modulated (FM) portion of the input signal 202. The envelope signal is provided to an input of a delay block 208. An output of the delay block 208 is provided to an input of an envelope amplifier 212. An output of the envelope amplifier 212 is provided to an envelope input of an envelope combining PA shown as an envelope combiner 216.

The FM signal from the envelope extractor 206 is provided to an input of an up-converter 210 and an output of the up-converter 210 is provided to an input of an amplifier 214. The up-converter 210 is optional and may be omitted. If the up-converter is omitted, then the FM output from the envelope extractor 206 is provided to the input of amplifier 214. An output of the amplifier 214 is provided to an FM input of the envelope combiner 216. An output of the envelope combiner 216 is provided to an output 204. The output 204 is the output of the PA. The amplifiers 212 and 214 are optional.

In one embodiment, the envelope combiner 216 is a gain-controlled amplifier 218 as shown in FIG. 2. The envelope input of the envelope combiner 216 is provided to a gain control input of the amplifier 218 and the FM input of the envelope combiner 216 is provided to a signal input of the amplifier 218. An output of the amplifier 218 is provided to the output of the envelope combiner 216.

FIG. 2 also shows various plots corresponding to waveforms in the feedforward PA 200. A frequency-domain plot 220 shows a frequency spectrum 224 corresponding to the spectrum of the input signal 202. A time-domain plot 222 shows a curve 224 corresponding to the input signal 202, a curve 223 corresponding to the positive portion of envelope of the waveform 224, and a curve 221 corresponding to the negative portion of envelope of the waveform 224.

A frequency-domain plot 230 shows a frequency spectrum 232 corresponding to the spectrum of the envelope signal at the envelope output of the envelope extractor 206. A time-domain plot 240 shows a curve 242 corresponding to the envelope signal. The envelope shown in the curve 242 is approximately the same as the curve 223.

A time-domain plot 250 shows a waveform 252 corresponding to the FM signal at the FM output of the envelope extractor 206. The waveform 252 has an envelope that is approximately constant. A frequency-domain plot 270 shows a curve 272 corresponding to the spectrum of the FM signal. The bandwidth of the spectrum 272 is broader than the bandwidth of the spectrum 224 because the spectrum 272 is a constant envelope whereas the spectrum 272 is a non-constant envelope. However, the center frequency of the spectrum 272 is approximately the same as the center frequency of the spectrum 224.

A time-domain plot 280 shows a waveform 282 corresponding to the output signal on the line 204. A frequency-domain plot 260 shows a spectrum 262 corresponding to the spectrum of the output signal. The output spectrum 262 is approximately the same as the input spectrum 224 to within a constant gain factor. Likewise, the output curve 282 is approximately the same as the input curve 224 to within a constant gain factor.

The envelope extractor 206 decomposes the input signal into an envelope signal and an FM signal. In general, the input signal has a time-varying amplitude component and a time-varying FM component. The FM signal has a constant envelope, and thus it is the envelope signal that contains the time-varying envelope component from the input signal. By contrast, the envelope signal is at a lower frequency than the input signal, and thus the time-varying FM component of the input signal is carried by the FM signal. Mathematically, the FM and envelope portions of a signal f(t) may be described as:

$$f(t)=Re[a(t)Ke^{j[\omega_c t+\gamma(t)]}] \quad (1)$$

where a(t) is the envelope portion and $Ke^{j[\omega_c t+\gamma(t)]}$ is the FM portion (where $\omega_c$ is the carrier frequency, K is a constant gain factor, and $\gamma(t)$ is the time-varying angle with respect to the carrier. The time dependence provided by the term $\gamma(t)$ is sufficient to describe both frequency modulation and phase modulation. The envelope portion a(t) is positive and real valued such that a(t)=|a(t)|. For a pure frequency-modulated signal (e.g., an FM broadcast signal) the envelope portion a(t) is a constant.

Stated differently, if the input signal is viewed as an amplitude-modulated signal, then the envelope signal is the baseband component and the FM signal is the RF component. Accordingly, the FM signal may be up-converted by the up-converter 210 without affecting the envelope signal 209, in the same way that up-converting an amplitude-modulated signal from an Intermediate Frequency (IF) to RF does not change the envelope of the up-converted signal. Thus, the FM signal provided by the envelope extractor 206, may be up-converted to RF. The FM signal has a constant envelope, and up-converting to RF will not change the nature of the envelope. This is clear from Equation (1) because a up-conversion merely changes the value of the carrier $\omega_c$ and thus has no effect on the envelope a(t).

After up-conversion, the output of the up-converter 210 will be a constant envelope FM signal. The constant envelope FM signal is provided by the up-converter 210 to the optional amplifier 214. Since the signal provided to the amplifier 214 has a constant envelope, the amplifier 214 may operate at full power (e.g., at or near saturation) at all times. The amplifier 214 may be a Class D amplifier. Even if the amplifier 214 is a Class A amplifier, it will operate near its region of maximum efficiency because it operates at full power. However, the amplifier 214 need not operate at high power levels. In one embodiment, the amplifier 214 is a single stage amplifier, corresponding approximately to the first gain stage 106 shown in FIG. 1. In another embodiment, the amplifier 214 is a two-stage amplifier, corresponding approximately to the first gain stage 106 and the second gain stage 107 shown in FIG. 1. In general, the amplifier 214 is an n-stage amplifier. The number of stages is determined by the signal output level of the up-converter 210, the drive signal requirements of the combiner 216, and the amount of gain that can be provided by each gain stage.

The amplifier 212 amplifies the envelope signal, but since the envelope signal is operating at baseband, the amplifier 212 is typically not an RF amplifier. In a cellular telephone application, the amplifier 212 is a baseband frequency amplifier. Techniques for building efficient solid-state amplifiers are known in the art, and thus the amplifier 212 may be made to operate in a power efficient manner. Even if the amplifier 212 is a Class A amplifier, it will still typically operate more efficiently than an RF Class A amplifier because solid-state devices typically operate more efficiently at lower frequencies. The amplifier 212 may be omitted when the output of the delay 208 is sufficient to drive the envelope input of the envelope combiner 216. Typically, the FM signal is amplified more than the envelope signal.

The envelope signal propagates along an envelope signal path from the envelope output of the envelope extractor 206 to the envelope input of the envelope combiner 216. The FM signal propagates along an FM signal path from the FM output of the envelope extractor 206 to the FM input of the envelope combiner 216. The envelope combiner 216 recombines the envelope signal and the FM signal to produce an output signal. The envelope combiner 216 effectively amplitude-modulates the FM signal according to the amplitude of the envelope signal. If the up-converter 210 is not provided, then the output signal will be an amplified replica of the input signal. If the up-converter 210 is provided, then the output signal will be an up-converted and amplified replica of the input signal.

If the envelope signal and the FM signal are properly recombined, then the bandwidth of the output signal will be approximately the same as the bandwidth of the original input signal 202. If the envelope signal and the FM signal are not properly recombined, then the bandwidth of the output signal will be broader than the bandwidth of the original input signal 202. The increase in the bandwidth is known a spectral regrowth. Proper recombination depends, in part, on matching the time delay in the FM signal path to the time delay in the envelope signal path. Proper recombination also depends on the envelope depth being appropriate for the output power level. In other words, the peak-to-average envelope output power should be faithfully reproduced. Since the time delay in the FM signal path is often longer than the time delay in the envelope signal path, the time delay 208 is added to the envelope signal path.

The time delay 208 adds enough additional delay to the envelope signal path such that the time delay of the envelope signal path matches the time delay of the FM signal path.

The time delay 208 is added to the envelope signal path because the envelope signal path is usually shorter than the FM signal path. In transmitters where the reverse is true, then the time delay 208 is moved to the FM signal path. The time delay 208 is a fixed time delay when the other components of the transmitter 200 are sufficiently stable with time and temperature to maintain the desired synchronization between the envelope and FM signal paths. In many systems, the travel time required for a signal to traverse the system is a function of the temperature of the system. This variation in travel time versus temperature can be reduced by increasing the bandwidth of the signal path. Moreover, it is the differential variation (i.e., the difference between the travel time through the envelope signal path and the FM signal path) that is adjusted by the time delay 208. Common mode variations (i.e., changes that occur in both signal paths) are less important. In a preferred embodiment, the envelope signal path and the FM signal path are provided with sufficient bandwidth such that the differential variation in the signal travel time through the two paths is relatively small, and the time delay 208 is a fixed time delay.

In an alternative embodiment, the time delay 208 is an adaptive variable time delay that adjusts the amount of time delay provided by the time delay 208 in order to reduce spectral regrowth in the output signal. The time delay 208 is configured as a variable time delay when the other components of the transmitter 200 are not sufficiently stable with time and temperature to maintain the desired synchronization. In one embodiment, the variation of an adaptive time delay is controlled by a sensor (such as a temperature sensor) that detects instabilities in the other components and/or a filter that detects spectral regrowth in the output signal.

If these envelope and FM signals are not properly synchronized, the resulting spectral regrowth can be large.

Figure 9:
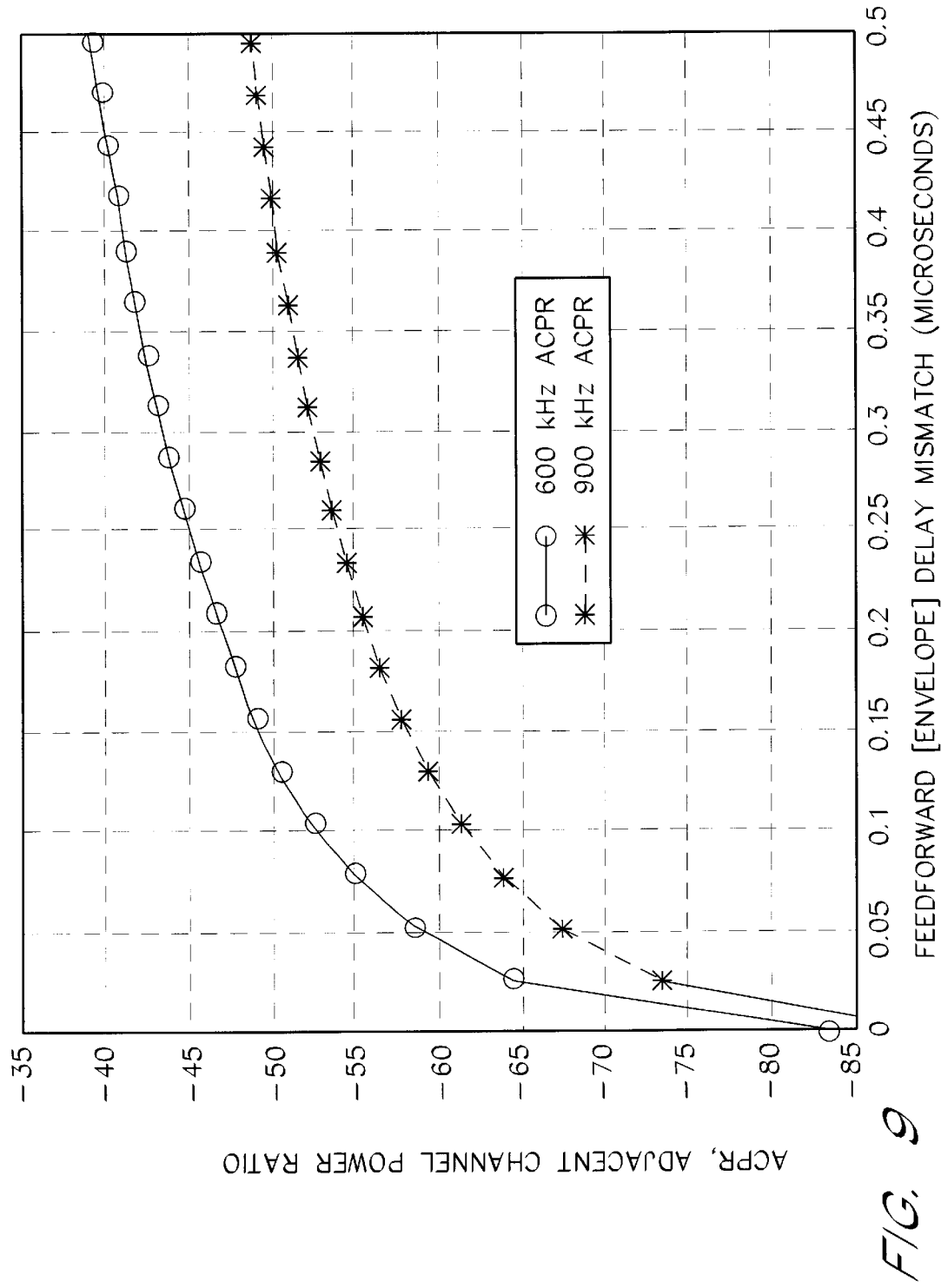
FIG. 9 is a plot showing Adjacent Channel Power Ratio (ACPR) in dBc (Decibels above the carrier) versus the feedforward envelope delay mismatch in microseconds for a typical PHS system using the transmitter shown in FIG. 7A.
Figure 10:
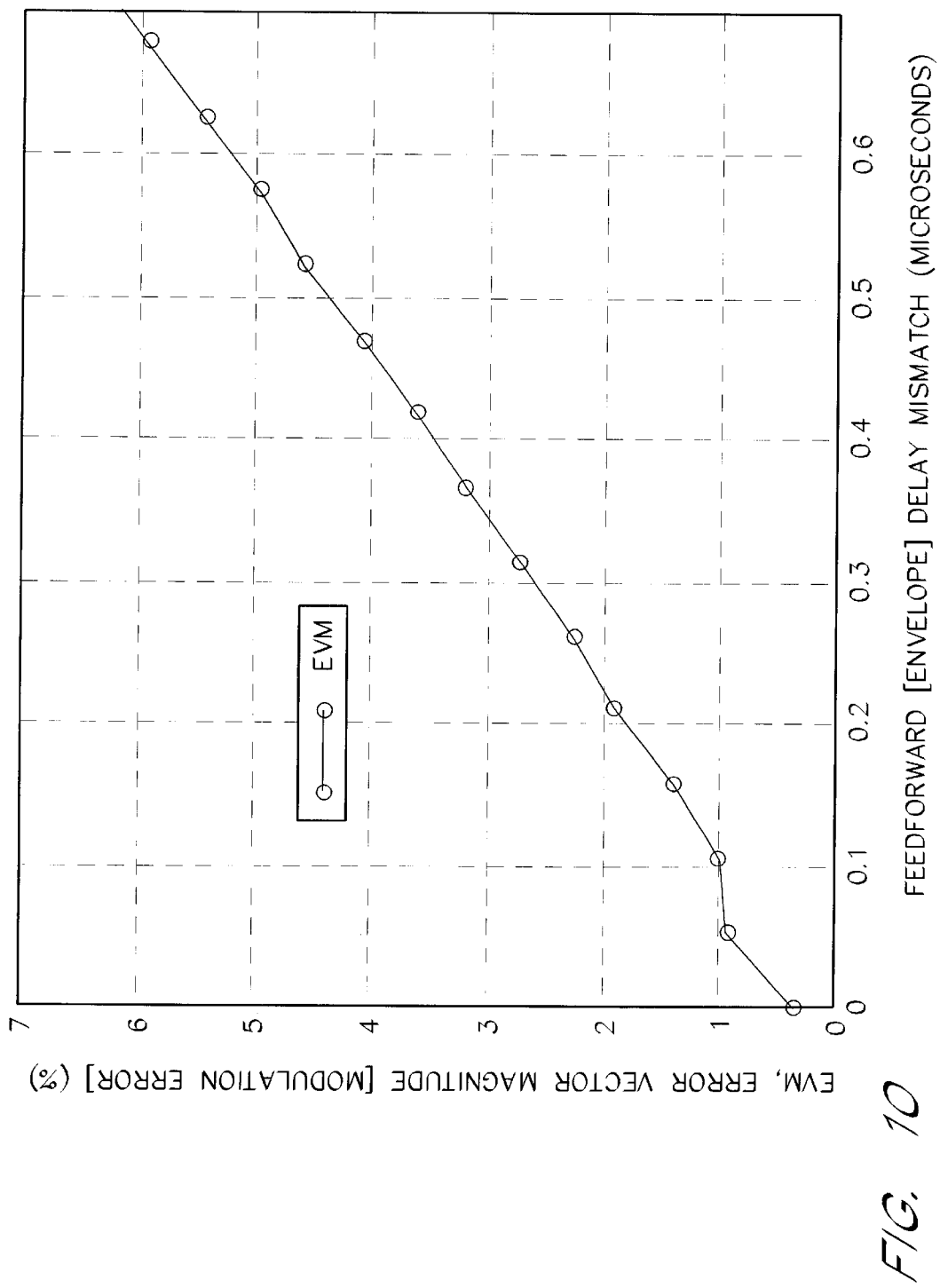
FIG. 10 is a plot showing Error Vector Magnitude (EVM) in percent versus the feedforward envelope delay mismatch in microseconds for a typical PHS system using the transmitter shown in FIG. 7A.

The time delay block 208 can be implemented using analog devices or digital devices. Digital delay compensation provides a relatively easy way to control the delay in the envelope path and thus ensure that the delay in the envelope path matches the delay in the FM path. Specific examples of the effect of delay mismatch between the envelope signal path and the FM signal path are shown in FIGS. 9 and 10 in connection with the quadrature feedforward transmitter 700 shown in FIG. 7.

The envelope combiner amplitude modulates the FM signal by multiplying the FM signal with the envelope signal. The gain-controlled amplifier 218 shown in FIG. 2 is one embodiment of an envelope combiner. Since the amplitude of the envelope of the FM signal is constant, it is the envelope signal that carries the amplitude variations in the envelope of the output waveform. The gain-controlled amplifier 218 shows, very simply, how the amplitude of the FM signal can be varied according to the envelope signal.

Figure 3:
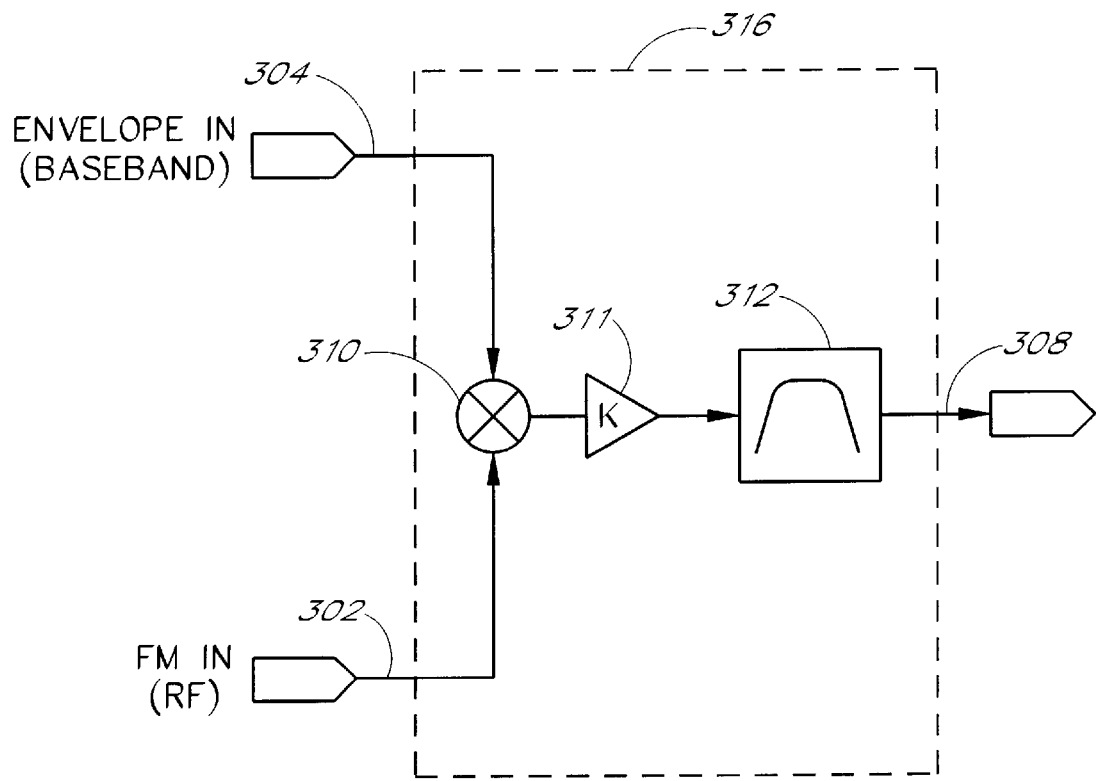
FIG. 3 is a block diagram of an envelope combiner that uses a mixer with conversion gain to combine an FM signal and an envelope signal.

The FM signal is, in some embodiments, an RF signal, and thus the amplifier 218 in these embodiments is an RF amplifier. FIG. 3 is a block diagram of an envelope combiner 316 that avoids the use of an amplifier, and instead, uses a mixer 310 to combine the FM signal and the envelope signal. The envelope combiner 316 has an envelope input 304, an FM input 302, and a combined output 308. The envelope combiner 316 may be used in place of the envelope combiner 216. The envelope input 304 is provided to a first input of the mixer 310 and the FM input 302 is provided to a second input of the mixer 310. An output of the mixer 310 is provided to an input of a bandpass filter 312 and an output of the bandpass filter 312 is provided to the output 308.

Mathematically, the gain controlled amplifier 218 used in the envelope combiner 216 multiplies the FM signal by a gain factor that is provided by the envelope signal. The mixer 310 used in the envelope combiner 316 performs the same mathematical operation, but without the use of an amplifier. In fact, the mixer 310 may be a passive device (many mixers use diodes). One skilled in the art will recognize that a passive mixer cannot provide more power out than power in, whereas an active device, such as the amplifier 218 can provide gain. The envelope combiner 316 relies on the gain provided by the amplifier 212 and 214. In other words, when comparing FIG. 1 and FIG. 2, the gain provided by the amplifiers 106–108 in FIG. 1. is provided by the amplifiers 212 and 214 in FIG. 2 (when using a passive envelope combiner).

The mixer 316 multiplies the envelope signal by the FM signal and, mathematically, in terms of the power in the output signal, it matters little whether most of the gain is provided by the amplifier 212 or the amplifier 214. Since the amplifier 212 is typically more efficient than the amplifier 214, it is typically desirable to provide relatively more power (e.g., gain) from the amplifier 212 and relatively less power (e.g., gain) from the amplifier 214.

Since the envelope and FM signals have different frequency components, the multiplication produces sum and difference products of the various frequencies in the two signals. The filter 312 selects the desired frequencies and provides these frequencies at the output 308.

Figure 4A:
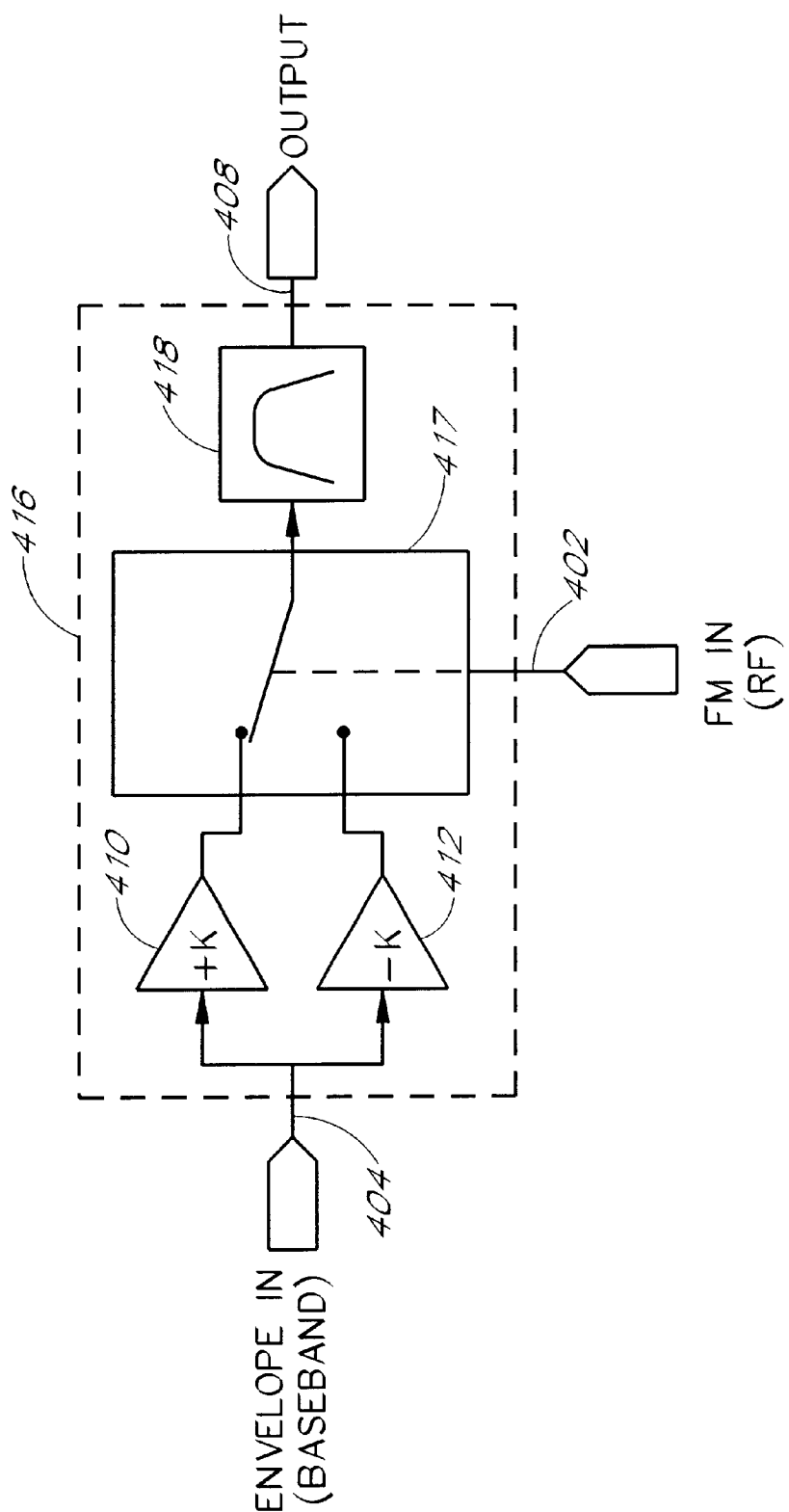
FIG. 4A is a block diagram of an envelope combiner that uses a switch with double-ended (push-pull) inputs to combine an FM signal and an envelope signal.

FIG. 4A is a block diagram of yet another envelope combiner 416 based on a solid state Single-Pole Double-Throw (SPDT) switch 417. The switching envelope combiner 416 may be used in place of the envelope combiner 216. The envelope combiner 416 shows an envelope input 404, an FM input 402, and a combined output 408. The envelope input 404 is provided to an input of a non-inverting amplifier 410 having a gain K and to an input of an inverting amplifier 412 having a gain −K. An output of the non-inverting amplifier 410 is provided to the first throw of the SPDT switch 417 and an output of the inverting amplifier 412 is provided to the second throw of the SPDT switch 417. The pole of the SPDT switch 417 is provided to an input of a filter 418 and an output of the filter 418 is provided to the output 408. The FM input 402 is provided to a control input of the SPDT switch 417.

One skilled in the art will recognize that other embodiments of the envelope combiner 416 are possible. The non-inverting amplifier 410 may be removed (replaced by a short) if the inverting amplifier has no power gain (K=1). Both the non-inverting amplifier 410 and the inverting amplifier 412 may be removed if the amplifier 212 provides inverted and non-inverted outputs, in which case the inverting output is provided to the first throw and the non-inverting output is provided to the second throw (or vice versa).

In yet another embodiment, the functions of the switch 417 and the amplifiers 410 and 412 are combined into a single power amplifier-switch. The amplifier-switch may provide sufficient power amplification such that the amplifiers 212 and 214 are relatively low-power amplifiers.

Figure 4B:
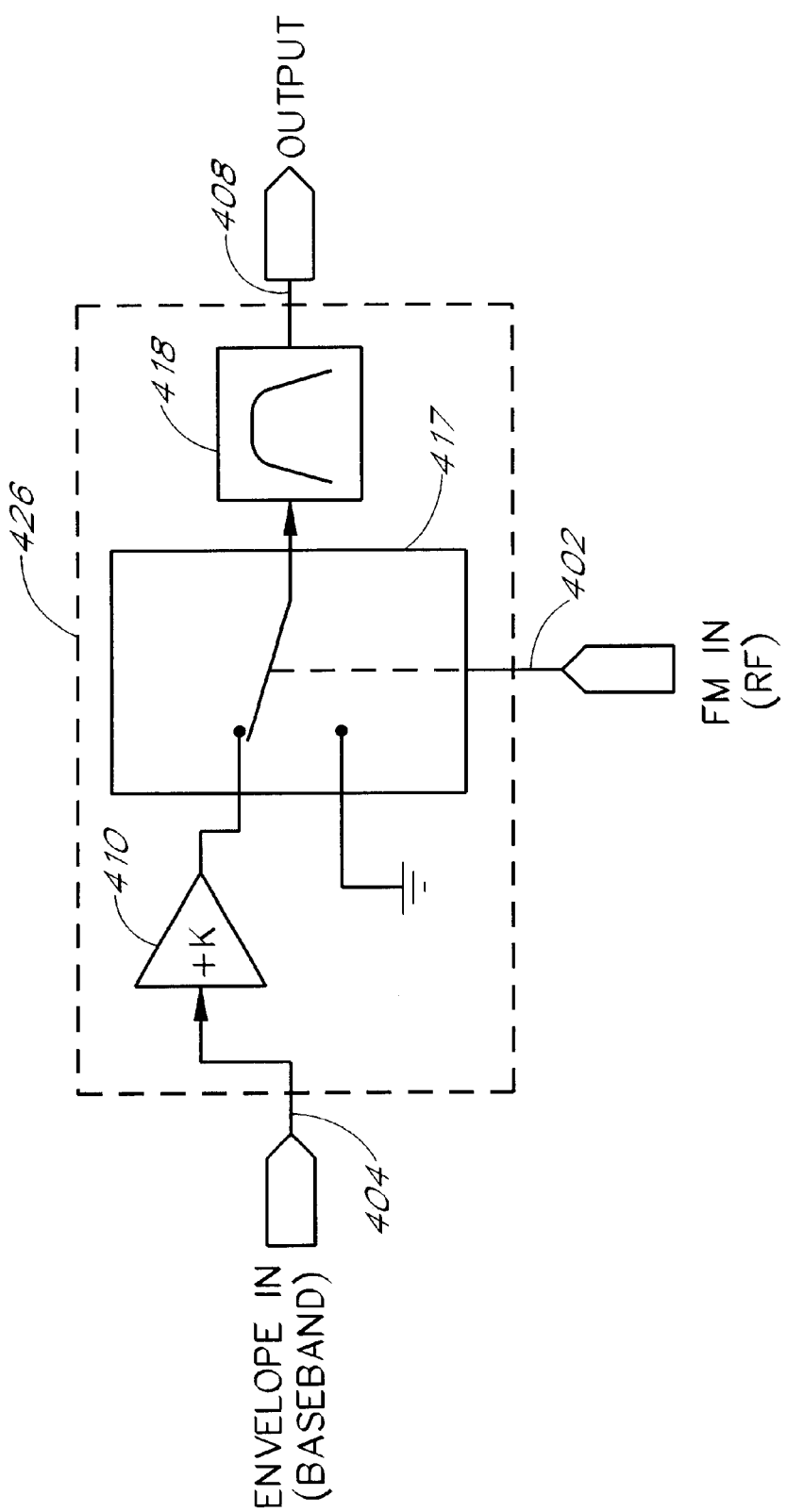
FIG. 4B is a block diagram of an envelope combiner that uses a switch with single-ended inputs to combine an FM signal and an envelope signal.

FIG. 4B is a block diagram of yet another envelope combiner 426 based on the solid state Single-Pole Double-Throw (SPDT) switch 417. The switching envelope combiner 426 may be used in place of the envelope combiner 416. The envelope combiner 426 shows an envelope input 404, an FM input 402, and a combined output 408. The envelope input 404 is provided to an input of the non-inverting amplifier 410 having a gain K. An output of the non-inverting amplifier 410 is provided to the first throw of the SPDT switch 417 and the second throw of the SPDT switch 417 is provided to ground. The pole of the SPDT switch 417 is provided to an input of a filter 418 and an output of the filter 418 is provided to the output 408. The FM input 402 is provided to a control input of the SPDT switch 417.

In both FIGS. 4A and 4B, the FM signal controls the switch 417. When the FM signal is positive, then the switch 417 switches to the first throw, and when the FM signal is negative, then the switch 417 switches to the second throw. Most of the power gain comes from the switch 417 acting like a Class D amplifier. The envelope input 404 changes the output swing of the Class D amplifier. Efficiency is enhanced when the gain K is such that a small envelope control produces a large output swing. The amplifier 214 need only provide enough power to operate the switch 416. The envelope combiner 416 operates as a sampled data system, with the switch 416, as the sampler. Like most samplers, the signal on the output of the sampler (i.e., on the throw of the switch 417) will contain many sidebands. The filter 408 selects the desired sideband. In one embodiment, the filter 418 is a bandpass filter tuned to the same frequency band as the FM signal provided at the input 402, but with a bandwidth that corresponds to the input signal provided at the input 202 in FIG. 2.

Figure 4C:
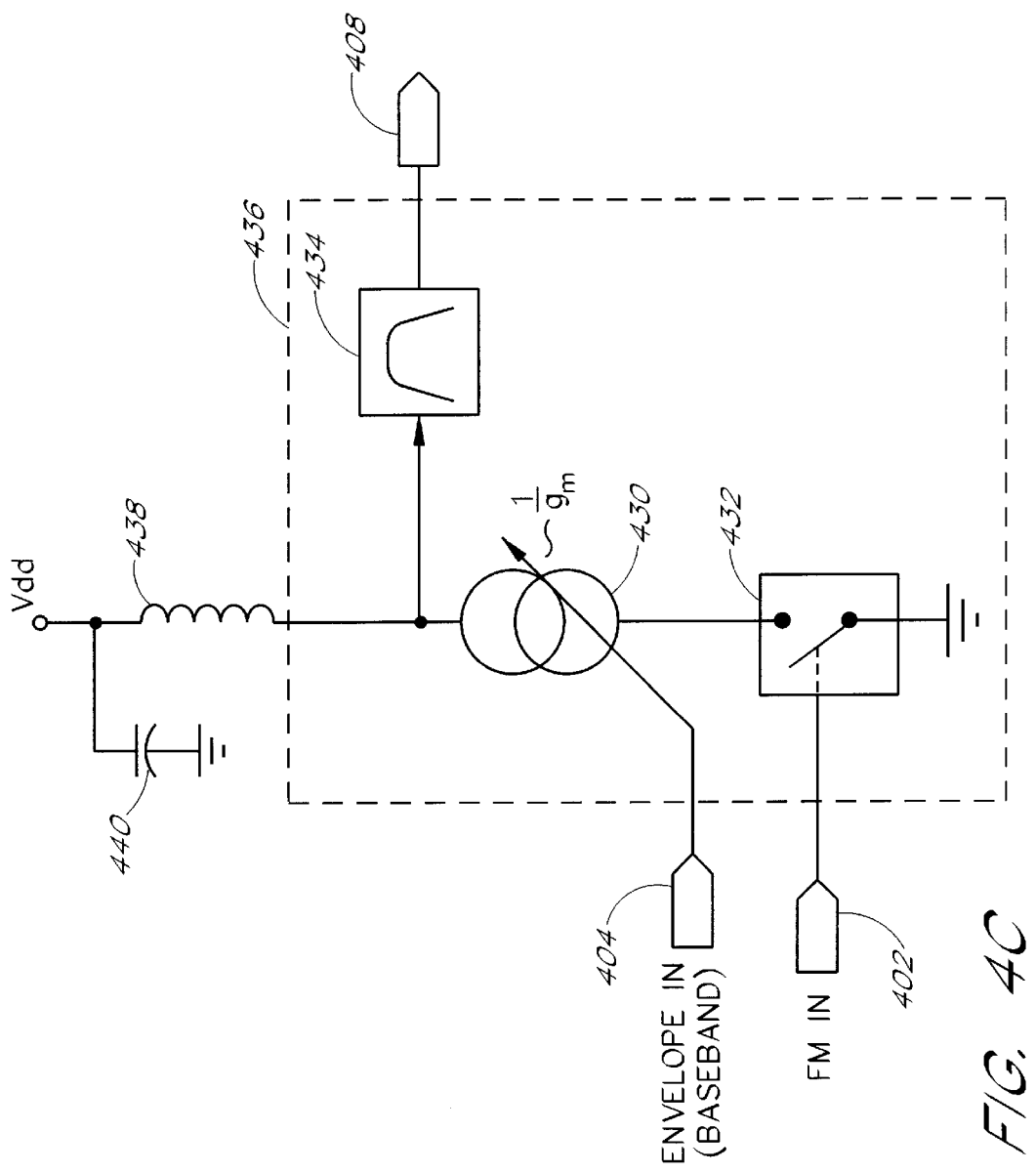
FIG. 4C is a block diagram of an envelope combiner that uses a switch and a variable gain element to combine an FM signal and an envelope signal.

FIG. 4C is a block diagram of yet another envelope combiner 436 based on a solid state Single-Pole Single-Throw (SPST) switch 432. The switching envelope combiner 436 may be used in place of the envelope combiner 416. The envelope combiner 436 shows an envelope input 404, an FM input 402, and a combined output 408. The envelope input 404 is provided to a control input of a controlled current source 430 having a transconductance gm. A first terminal output of the current source 430 is provided to a first terminal of the SPST switch 432 and the second terminal of the SPDT switch 432 is provided to ground. The FM input 402 is provided to a control input of the SPST switch 432. A second terminal of the current source 430 is provided to an input terminal of a filter 434 and an output terminal of the filter 434-is provided to the combiner output 408. The second terminal of the current source 430 is also provided to a first terminal of an inductor 438. A power supply voltage VDD is provided to a second terminal of the inductor 438. The power supply VDD is bypassed by a bypass capacitor 440 connected between the VDD supply and ground.

In FIG. 4C, the FM signal controls the switch 434. When the FM signal is positive, then the switch 434 switch closes and the current source 430 delivers current to the filter 434. When the FM signal is negative, then the switch 434 opens and the current flow stops. Most of the power gain comes from the switch 434 acting like a Class D amplifier that provides pulses of current to the filter 434. The envelope input 404 changes the amplitude of the current pulses. Efficiency is enhanced when the transconductance $g_m$ is such that a relatively small envelope control voltage produces relatively large current pulses. The amplifier 214 need only provide enough power to operate the switch 434. The envelope combiner 436 operates as a sampled data system, with the switch 436, as the sampler. Like most samplers, the signal on the output of the sampler will contain many sidebands. The filter 434 selects the desired sideband. In one embodiment, the filter 434 is a bandpass filter tuned to the same frequency band as the FM signal provided at the input 402, but with a bandwidth that corresponds to the input signal provided at the input 202 in FIG. 2.

Figure 5:
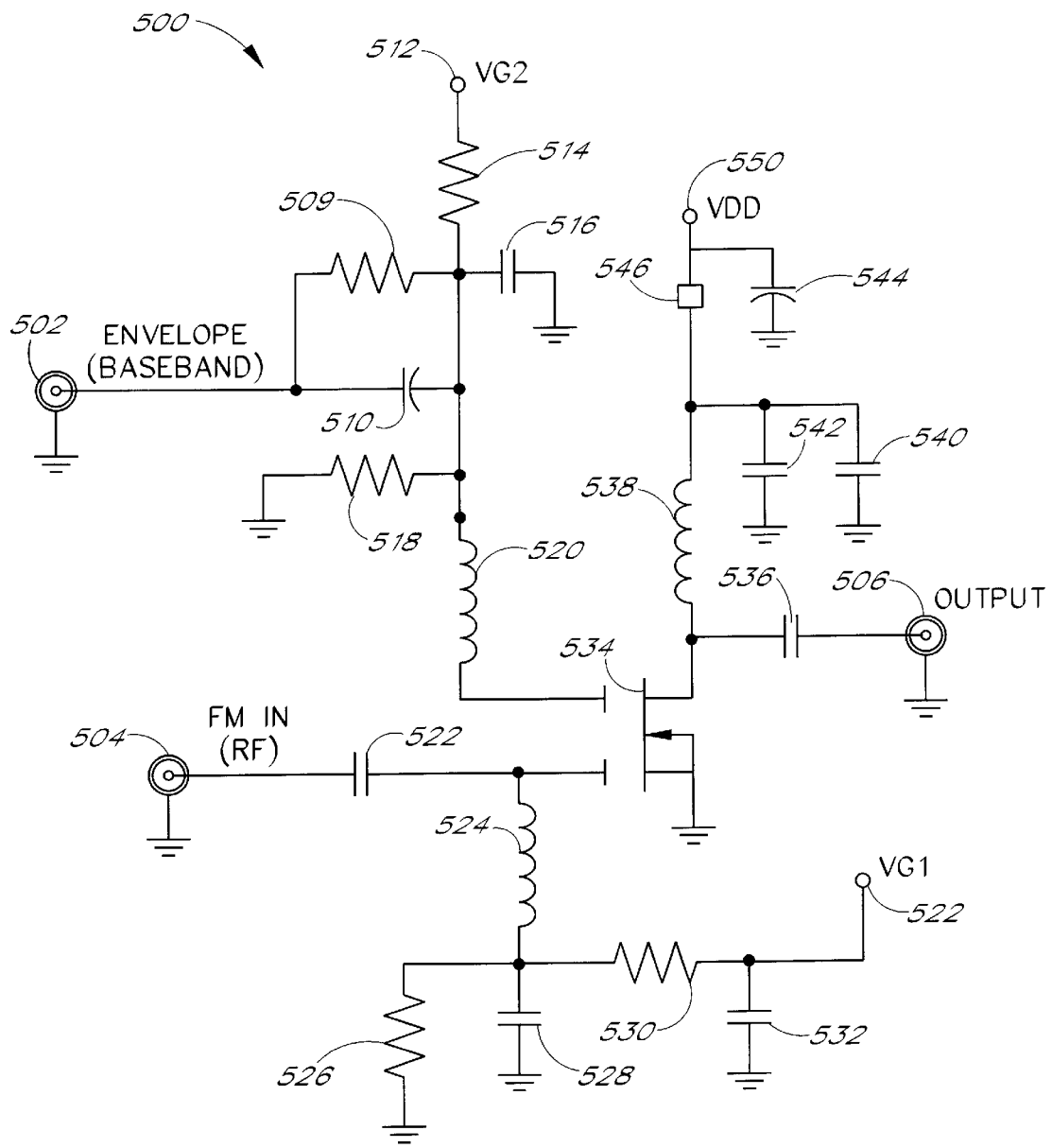
FIG. 5 is a circuit schematic of an envelope combiner switch that uses a dual gate FET.

FIG. 5 is a circuit schematic of a switching envelope combiner 500 that uses a dual gate FET 534 as a power amplifier-switch. The circuit shown in FIG. 5 functions according to the block diagram shown in FIG. 4C where the FET 534 is an active element used to provide the functions represented by the current source 430 and the switch 432. In FIG. 5, an envelope input 502 is provided to a first terminal of a capacitor 510. A resistor 509 is connected in parallel with the capacitor 510. A second terminal of the capacitor 510 is provided to a first terminal of a resistor 518, to a first terminal of an inductor 520, to a first terminal of a capacitor 516, and to a first terminal of a resistor 514. A second terminal of the resistor 514 is provided to a power supply input VG2 512. A second terminal of the capacitor 516 is provided to ground. A second terminal of the resistor 518 is provided to ground, and a second terminal of the inductor 520 is provided to a second gate of the FET 534.

An FM input 504 is provided to a first terminal of a DC-blocking capacitor 522. A second terminal of the DC-blocking capacitor 522 is provided to a first terminal of an inductor 524 and to a first gate of the FET 534. A second terminal of the inductor 524 is provided to a grounded resistor 526, to a grounded capacitor 528, and to a first terminal of a resistor 530. A second terminal of the resistor 530 is provided to a grounded capacitor 532 and to a power supply input VG1 522.

A power supply input VDD 550 is provided to a first terminal of a grounded bypass capacitor 544 and to a first terminal of an inductor 546. A second terminal of the inductor 546 is provided to a first terminal of an inductor 538, to a grounded capacitor 542 and to a grounded capacitor 540. In a preferred embodiment, the inductor 546 is a wire through a ferrite bead. A second terminal of the inductor 538 is provided to a first terminal of a DC-blocking capacitor 536 and to a drain of the FET 534. A second terminal of the DC-blocking capacitor 536 is provided to a combined output 506. A source of the FET 534 is provided to ground.

In a preferred embodiment for a PHS system, the FET 534 is a dual-gate MESFET. The ferrite bead of the inductor 546 is an F bead. The capacitors 522, 542, 536, 516 and 528 are each 15 pF (pico-Farad) capacitors. The capacitors 532 and 540 are 1000 pF capacitors. The capacitor 544 is a 4.7 $\mu$F (micro-Farad) capacitor and the capacitor 510 is a 1.0 $\mu$F capacitor. The inductors 524 and 538 are 15 nH (nano-Henry) inductors and the inductor 520 is a 75 nH inductor. The resistors 518 and 526 are 1.0 M-Ohm (Mega-Ohm) resistors and the resistor 530 is a 10 k-Ohm (kilo-Ohm) resistor. The power supply voltage VG1 522 is 1.9 V (Volts) to 5 V, the power supply voltage VG2 512 is −1.0 to −3.0 V, and the power supply voltage VDD 550 is 1.9 V to 5 V. The higher voltages generally provide more output power and the lower voltages generally provide lower output power, but this is load-line dependent.

When used with the component values above in a PHS system, the FM signal provided to the FM input 504 is a band-limited signal RF signal with a center (carrier) frequency of approximately 1.9 GHz, and the envelope signal provided to the envelope input 502 is a baseband signal with most of its spectral components below 300 kHz (kilo-Hertz). The output signal 506 after bandpass filtering by a bandpass filter, such as the filter 418 shown in FIG. 4, is a PHS transmitter signal having a bandwidth of approximately 300 kHz at a center frequency of approximately 1.9 MHz.

The dual-gate FET 534 operates as a common source amplifier, providing primarily current gain with little, if any, voltage gain. The first gate of the FET 534 is biased by a voltage divider using the resistor 530 and the resistor 526. First gate is biased such that the FET 534 is in an "off" state (pinch-off) when there are no input signals to the input 504. The FM signal, provided at the input 504, is coupled through a DC-blocking capacitor 522 to the second gate. The FM signal operates to switch the FET 534 between the off state and a fully "on" (saturated) state in a manner similar to a Class-D switching amplifier.

The second gate of the FET 534 is biased by a voltage divider using the resistors 514 and 518. An envelope signal provided at the input 502 is coupled through a bandpass filter (the series combination of the capacitor 510 and the RF blocking inductor 520) to the second gate of the FET 534. The envelope signal provided to the second gate controls the $g_m$ (transconductance) of the FET 534. Thus, the RF signal applied to the first gate controls when the FET 534 is on and off, and the envelope signal applied to the second gate controls the current provided by the FET 534 when the FET 534 is in the on state. The linearity of the envelope combiner 500 depends, in part, on the linearity of the transconductance $g_m$. The upper gate of the dual-gate FET 534 is preferably operating in its linear region to control $g_m$.

When the FET 534 is in the on state (saturated), current flows from the constant voltage power supply input VDD 550 and into the inductor 538. The RF signal applied to the first gate switches the FET 534 on and off to produce a series of current pulses through the inductor 538. The inductor 538 provides DC current to the FET 534 which converts the DC current to an RF current that is coupled through the DC-blocking capacitor 536 to the output 506.

The Feedforward PA with a Quadrature Mixer

The signal to be amplified by the PA and transmitted may be decomposed into the envelope component and FM component at many stages before the PA. Many transmitters use a quadrature mixer in combination with a quadrature encoder. The quadrature encoder provides an in-phase (I) channel and a quadrature-phase (Q) channel to the quadrature mixer. A feedforward power amplifier, as discussed in connection with FIGS. 2–4 may advantageously be used in systems that have a quadrature encoder.

Figure 6:
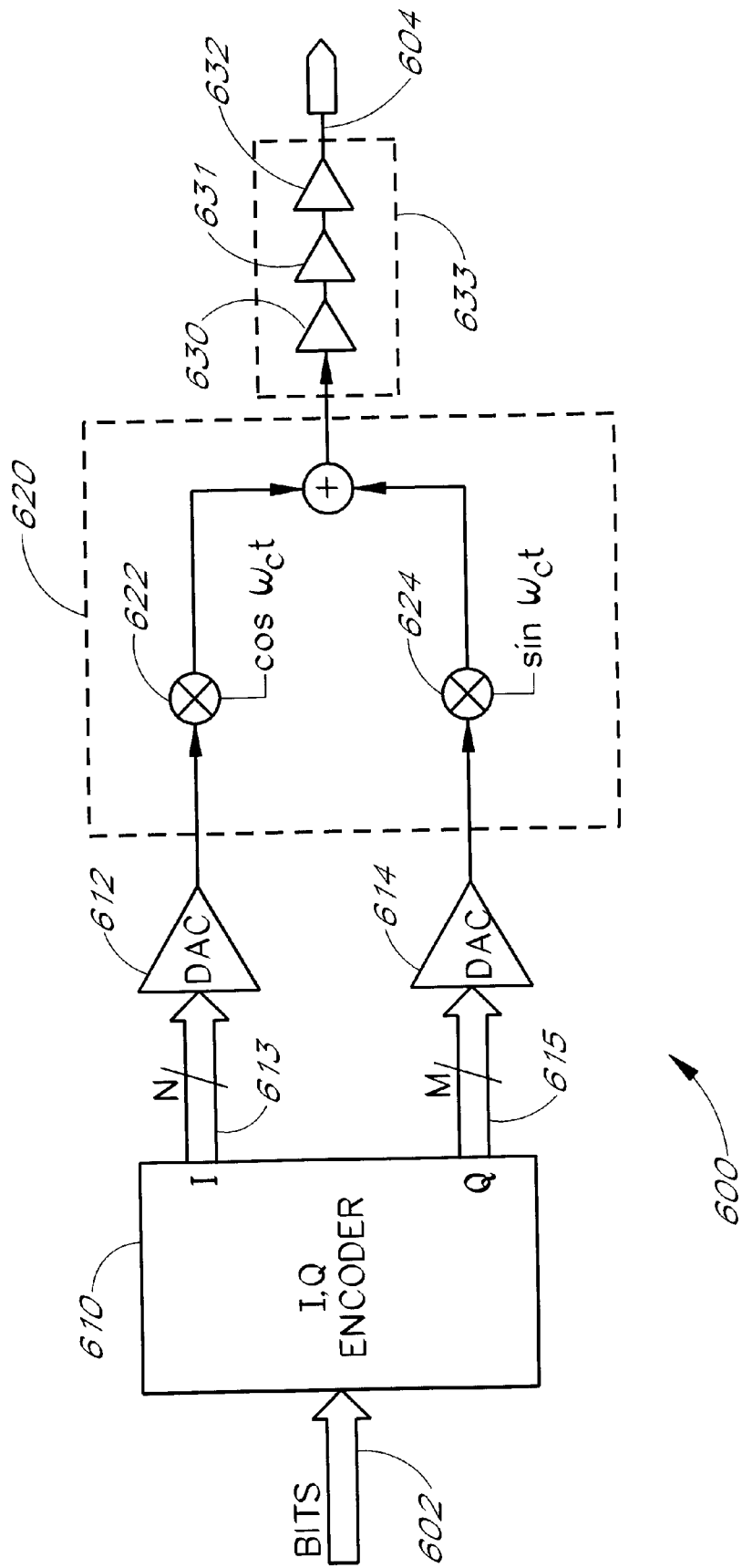
FIG. 6 is a block diagram of a prior art transmitter that uses an I-Q encoder and a quadrature mixer, and a conventional PA.

FIG. 6 is a block diagram of a conventional transmitter 600 that uses an I-Q encoder 610, a quadrature mixer 620, and a conventional PA 633. A π/4 DQPSK (Differential Quadrature Phase Shift Keying) encoder is an example of an I-Q encoder. In FIG. 6, a data signal 602 is provided to a data input of the encoder 610. The data signal may be data bits, such as digitized voice data in a digital cellular telephone, that are to be encoded and transmitted. An I channel output of the encoder 610 is provided to an input of a digital-to-analog converter 612 and an analog output of the digital-to-analog converter is provided to a first input of the quadrature mixer 620. The I channel data is N bits wide. A Q channel output of the encoder 610 is provided to an input of a digital-to-analog converter 614 and an analog output of the digital-to-analog converter is provided to a second input of the quadrature mixer 620. The Q channel data is M bits wide. In most systems, M=N.

The quadrature mixer 620 includes a first mixer 622, a second mixer 624, and an adder 626. The first input of the quadrature mixer 622 is provided to a first input of the first mixer 622. A Local Oscillator (LO) signal $\cos(\omega_c t)$ is provided to a second input of the first mixer 622. An output of the first mixer 622 is provided to a first input of the adder 626. The second input of the quadrature mixer 622 is provided to a first input of the second mixer 624. A Local Oscillator (LO) signal $\sin(\omega_c t)$ is provided to a second input of the second mixer 624. An output of the second mixer 624 is provided to a second input of the adder 626. An output of the adder 626 is provided as an output of the quadrature mixer 620.

The output of the quadrature mixer 620 is provided to an input of the PA 633, and an output of the PA 633 is provided as an output of the transmitter 600. The PA 633 is shown as a series of three gain stages 630-632 similar to the PA shown in FIG. 1.

Figure 7A:
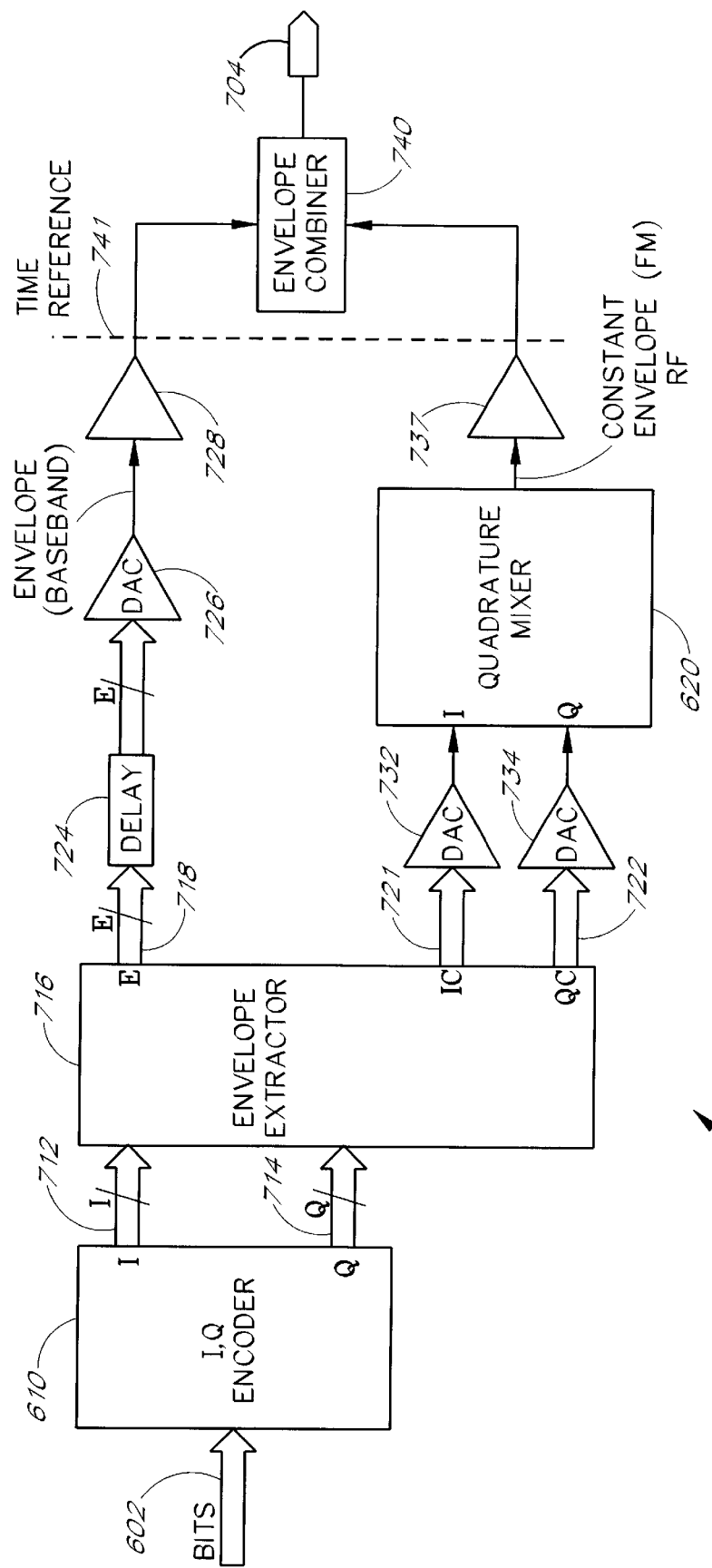
FIG. 7A is a block diagram of an improved transmitter that uses an I-Q encoder, a quadrature mixer, and an envelope feedforward PA.

FIG. 7A is a block diagram of an improved transmitter 700 that uses the quadrature encoder 610 and the quadrature mixer 620 in a feedforward PA configuration. As in FIG. 6, FIG. 7A shows the data input 602 provided to the quadrature encoder 610. The I and Q channel outputs from the quadrature encoder 610 are provided, respectively, to I and Q channel inputs of a quadrature envelope extractor 716. The I channel is provided by an I bus 712 and the Q channel is provided by a Q bus 714. The quadrature envelope extractor 716 decomposes the signal represented by the I and Q channels into an envelope portion (E), a constant envelope in-phase (IC) FM portion and a constant envelope quadrature (QC) FM portion. The envelope portion E is given by the equation $E=\sqrt{I^2+Q^2}$, where sqrt is a square root. The IC portion is given by the equation IC=I/E and the QC portion is given by the equation QC=Q/E.

An envelope output (E) from the quadrature extractor 716 is provided by and E bus 718 to an input of a delay block 724. An output from the delay block 724 is provided to an input of an envelope digital-to-analog converter 726. An output of the envelope digital-to-analog converter 726 is provided to an input of an amplifier 728. An output of the amplifier 728 is provided to an envelope input of a feedforward envelope combiner 740.

As with the time delay 208, the time delay 724 may be moved to the FM signal path, and the time delay is either fixed or variable as needed to maintain the desire synchronization between the envelope signal path and the FM signal path.

The IC FM portion from the quadrature envelope extractor 716 is provided by an IC bus 721 to an input of a first digital-to-analog converter 732. The QC FM portion from the quadrature envelope extractor 716 is provided by a QC bus 722 to an input of a second digital-to-analog converter 734. An analog output from the first analog converter 732 is provided to the I channel input of the quadrature mixer 620 and an analog output from the second analog converter 734 is provided to the Q channel input of the quadrature mixer 620. An output of the quadrature mixer 620 is provided to an input of an amplifier 737. An output of the amplifier 737 is provided to an FM input of the envelope combiner 740.

An output of the envelope combiner is provided as an output 704 of the transmitter 700, where the output signal O may be expressed as O=E(IC+QC). The I bus 712 is NI bits wide, the Q bus 714 is NQ bits wide, E bus 718 is NE bits wide, the IC bus 721 is NIC bits wide, and the QC bus 722 is NQC bits wide. In one embodiment, NI=NQ and NIC=NQC.

Although the transmitter 700 is shown as a hybrid device having both digital and analog portions, one skilled in the art will recognize that the transmitter 700 may also be implemented using analog devices, digital devices, or software running on a digital processor. Power control inputs may be provided to the DACs, envelope combiner, and various gain elements in the system.

Figure 7B:
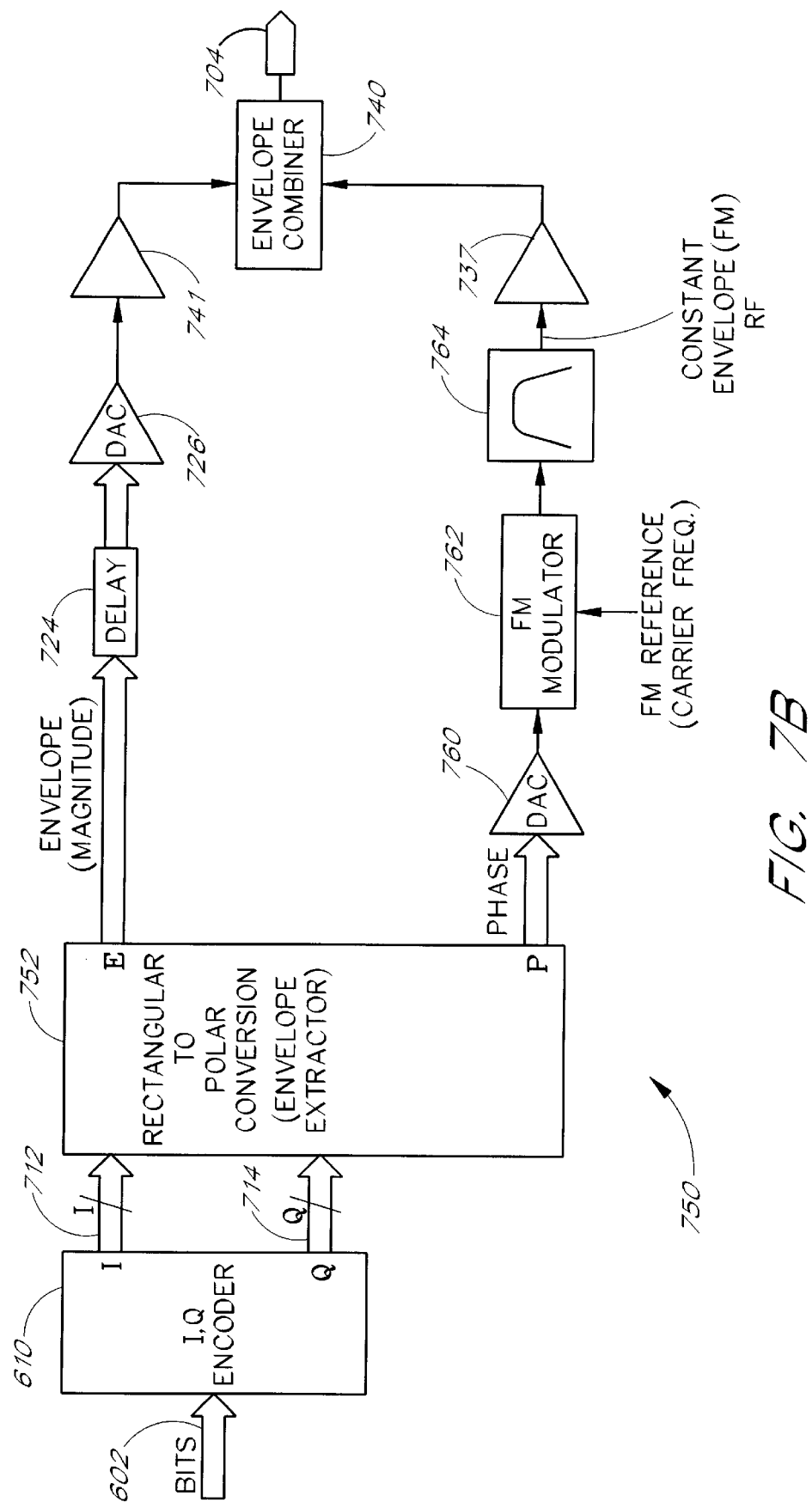
FIG. 7B is a block diagram of an improved transmitter that uses an FM modulator to convert a phase signal into an FM signal for an envelope feedforward PA.

FIG. 7B is a block diagram of an improved transmitter 750 that uses the quadrature encoder 610 and an FM modulator 762 in a feedforward PA configuration. As in FIG. 6, FIG. 7B shows the data input 602 provided to the quadrature encoder 610. The I and Q channel outputs from the quadrature encoder 610 are provided, respectively, to I and Q channel inputs of an quadrature envelope extractor 752. The I channel is provided by an I bus 712 and the Q channel is provided by a Q bus 714. The envelope extractor 152 decomposes the signal represented by the I and Q channels into an envelope portion and a phase portion.

An envelope output (E) from the extractor 752 is provided by an E bus 718 to an input of a delay block 724. An output from the delay block 724 is provided to an input of an envelope digital-to-analog converter 726. An output of the envelope digital-to-analog converter 726 is provided to an input of an amplifier 728. An output of the amplifier 728 is provided to an envelope input of a feedforward envelope combiner 740.

A phase output (P) from the extractor 752 is provided to an input of a digital-to-analog converter 760. An analog output from the analog converter 760 is provided to a modulation input of the FM modulator 762. A carrier frequency signal is provided to an FM reference input of the FM modulator 762. An FM output of the modulator 762 is an FM signal. The FM output of the modulator 762 is provided to an input of a wideband filter 764. An output of the filter 764 is provided to an input of an amplifier 737. An output of the amplifier 737 is provided to an FM input of the envelope combiner 740.

Figure 8A:
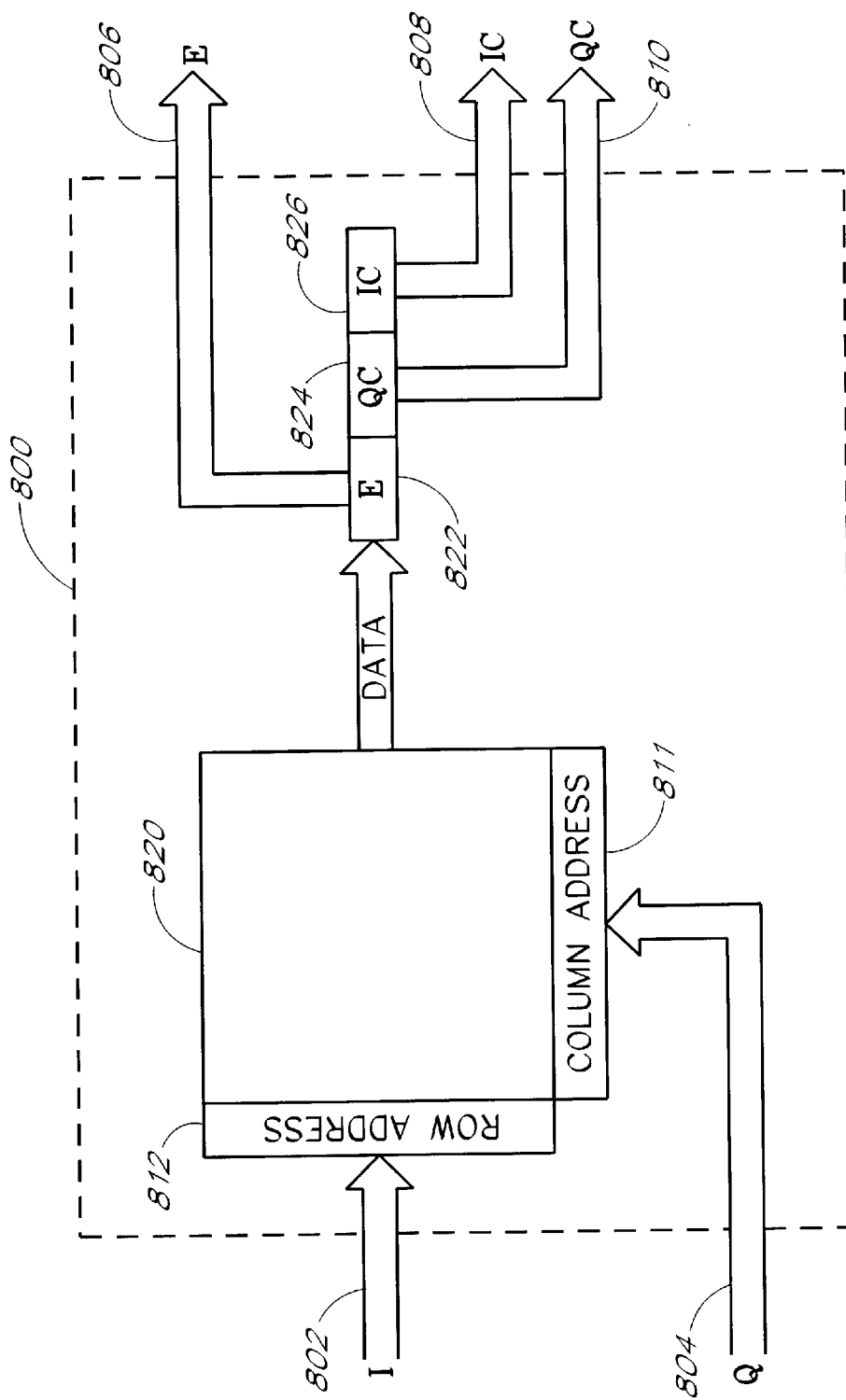
FIG. 8A is a block diagram of an envelope extractor that uses a lookup table to separate a signal, represented by I and Q channels, into an envelope portion and an FM portion, where the FM portion is represented by two new I and Q channels labeled IC and QC.

The feedforward envelope extractors discussed in connection with FIGS. 2, 7A and 7B may be constructed as analog devices, digital devices, software running on a digital processor, or digital-analog hybrids. FIG. 8 is a block diagram of a power-efficient digital quadrature envelope extractor 800 that uses a lookup table 820 to "calculate" the envelope portion E and FM portions IC and QC from the I and Q input channels. In a digital envelope extractor, calculation of the E, IC, and QC portions may be accomplished by conventional mathematical operations (e.g., add, subtract, multiply, divide, etc). However, in some implementations, the lookup table 820 consumes less power than mathematical hardware (e.g., a hardware multiplier)

and thus the lookup table 820 is relatively more power efficient. Moreover, the use of lookup tables reduces numerical errors, especially the numerical errors introduced by numerical calculations (e.g., round-off errors, numerical approximations, etc.). Such numerical errors can lead to poor ACPR performance.

In the envelope extractor 800, NI bits of I channel data from an I channel input 802 are provided to a row decoder 812 that selects a row in a lookup table 820. Similarly, NQ bits of Q channel data from a Q channel input 804 are provided to a column address decoder 812 that selects a column in the lookup table 820. The lookup table 820 has $2^{NI+NQ}$ cells arranged in $2^{NI}$ rows and $2^{NQ}$ columns. Each cell contains a E bit field 822 that is NE bits wide, an IC bit field 826 that is NIC bits wide, and a QC bit field 824 that is NIQ bits wide.

A particular cell is selected by using the input I bits to select a row of cells, and the input Q bits to select a cell in the selected row. The E bits from the selected cell are provided to an E output 806, the IC bits from the selected cell are provided to an IC output 808 and the QC bits from the selected cell are provided to a QC output 810. One skilled in the art will recognize that other lookup table arrangements can be used. For example, the single lookup table 820 can be decomposed into three lookup tables as an E table, an IC table, and a QC table.

Reductions in the size of the lookup table 820 are available by exploiting symmetries in the data stored in the table 820. Data in the I and Q inputs 802 and 804 is typically generated by a quadrature encoder. For many types of quadrature encoding, data in the lookup table 820 will be symmetric when the table 820 is broken up into four quadrants (i.e., one fourth of the lookup table) needs to be stored. Making the assumption that all inputs and outputs are 7 bits wide (NI, NQ, NIC, NQC, and NE are all equal to 7) then $(2^7 \times 2^7)/4 = 4096$ 7-bit words would be needed for each of the E, IC, and QC bit fields (either as one table where each cell is three 7-bit words, or three tables where each cell is one 7-bit word). The use of 7 bits for the inputs and outputs is typical of many voice-grade communication systems such as PHS, cellular telephones, etc. One skilled in the art will recognize that the assumption of 7 bits for the inputs and outputs is by way of example only and not intended as a limitation.

Further reductions in the size of the lookup tables are possible because the output E is unsigned, and the output values IC and QC carry the same sign bits as the input values I and Q, respectively. Thus, no sign bit is needed in addressing the E, I, and Q lookup tables, and no sign bit is necessary in the bit fields that contain E, IC and QC. The sign bits are simply removed from the I and Q inputs and appended to the IC and QC outputs as shown (for 7-bit I and Q channels) in FIG. 8B.

Figure 8B:
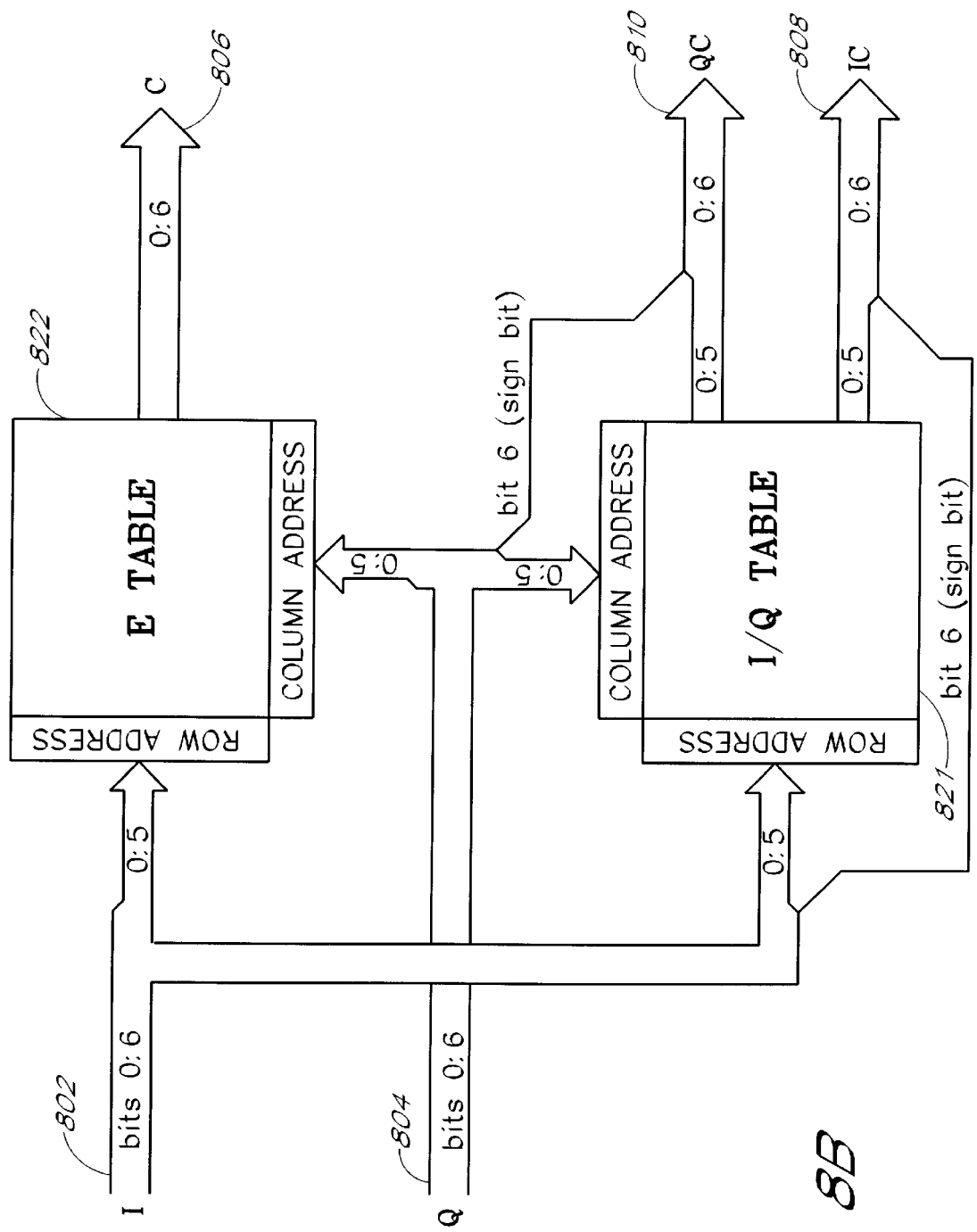
FIG. 8B is a block diagram of an envelope extractor that uses separate envelope and FM lookup tables to separate a signal, represented by I and Q channels, into an envelope portion and an FM portion, where the FM portion is represented by two new I and Q channels labeled IC and QC.

In FIG. 8B, a 7-bit I input bus 802 and a 7-bit Q input bus 804 each have data bits 0–5 and a sign bit 7. Bits 0–5 of the I bus 802 are provided to a row address decoder of an envelope (E) lookup table 822. Bits 0–5 of the Q bus 804 are provided to a column address decoder of the envelope (E) lookup table 822. A 7-bit output of the lookup table 822 is provided as an E output 806. Bits 0–5 of the I bus 802 are provided to a row address decoder of an I/Q lookup table 821. Bits 0–5 of the Q bus 804 are provided to a column address decoder of the I/Q lookup table 821. A 6-bit Q output of the lookup table 821 is combined with the sign bit (bit 7) from the Q bus 804 to produce a QC output 810. A 6-bit I output of the lookup table 821 is combined with the sign bit (bit 7) from the I bus 802 to produce an IC output 808. Again it is emphasized that the use of 7-bit buses for E, I, Q, IC, and QC is by way of example only, and not as a limitation.

In the above example, for the purposes of addressing rows and columns in a lookup table, removing the sign bit effectively reduces the number of address bits in I and Q from 7 bits to 6 bits. Moreover, since the sign bits for IC and QC are obtained from I and Q, the number of bits in each IC and QC field of the lookup table may be reduced from 7 to 6. Thus, in the above example, a total storage of 4096 7-bit words (envelope table), and 8192 (2*4096) 6-bit words (IC and QC tables together) is possible.

FIG. 9 is a plot showing the computed Adjacent Channel Power Ratio (ACPR) in dBc (Decibels above the carrier) versus the feedforward envelope delay mismatch in microseconds for a simulated PHS system using the transmitter architecture shown in FIG. 7A. The calculations shown in FIG. 9 are for a numerical simulation of a PHS system. A PHS system is used by way of example, and not as a limitation. The plot in FIG. 9 is computed for a PHS transmitter operating at a carrier frequency of approximately 1.9 GHz (GigaHertz) with a channel (frequency) bandwidth of approximately 300 kHz, corresponding to a time bandwidth of 3.0 $\mu$s (microseconds). A delay mismatch between the envelope signal and the FM signal will cause the bandwidth to increase due to spectral regrowth. Thus, at least to a first order, the required delay match is related to the time bandwidth. FIG. 9 shows that a 600 kHz ACPR (approximately twice the channel bandwidth) of −50 dBc requires that the envelope channel and the FM channel be matched to within approximately 0.25 ps, which is less than one tenth of the time bandwidth. A 600 kHz ACPR of −55 dBc requires that the envelope channel and the FM channel be matched to within approximately 0.05 $\mu$s, which is 60 times less than the time bandwidth. A 600 kHz ACPR of −55 dBc is typical of many PHS systems, and thus, in a typical PHS transmitter, it is preferred that the envelope channel and the FM channel be time matched to within approximately ±0.027 $\mu$s in order to meet ACPR requirements for the entire transmitter.

FIG. 10 is a plot showing a modulation Error Vector Magnitude (EVM) in percent versus the feedforward envelope delay mismatch in microseconds for a simulated PHS system using the transmitter architecture shown in FIG. 7A. EVM is the RMS modulation error (i.e., the RMS of the desired modulation vector minus the actual modulation vector) in relation to the length of the desired modulation vector. An increase in the EVM increases the bit error rate of the communications system. Although a typical PHS transmitter is expected to have an EVM of approximately 12.5%, an EVM of about 2% is typically allowed in the PA (the remaining 10.5% comes from other elements of the system). As shown in FIG. 10, an EVM of 1% corresponds to a 0.1 $\mu$s mismatch between the envelope channel and the FM channel. Thus, the allowable time mismatch associated with the EVM is much larger than the allowable mismatch time delay associated with ACPR. In other words, the sensitivity of EVM to delay mismatch is seen to be less that the sensitivity of ACPR to delay mismatch.

Other Embodiments

Although the foregoing has been a description and illustration of specific embodiments of the invention, various modifications and changes can be made thereto by persons skilled in the art, without departing from the scope and spirit of the invention as defined by the following claims.

What is claimed is:

1. An envelope feedforward power amplifier that provides high efficiency when amplifying signals having a non-constant envelope, comprising:

an envelope extractor configured to separate an input signal into a first signal having a non constant envelope and a second signal having a constant envelope;

a time delay operatively coupled to said envelope extractor and configured to delay said first signal to produce a delayed signal;

a first amplifier operatively coupled to said time delay and configured to amplify said delayed signal to produce a modulation signal;

an up-converter operatively coupled to said envelope extractor and configured to up-convert said second signal to a higher frequency to produce an up-converted signal, said up-converted signal having a substantially constant envelope;

a second amplifier operatively coupled to said up-converter and configured to amplify said up-converted signal to produce a carrier signal, said second amplifier operating at a constant power level near saturation; and an envelope combiner operatively coupled to an output of said first amplifier and said second amplifier, said envelope combiner configured to use said modulation signal to amplitude modulate said carrier signal, said time delay configured to provide a time delay so that said modulation signal and said carrier signal arrive at said envelope combiner at substantially the same time.

2. An envelope feedforward amplifier, comprising:

an envelope extractor configured to separate an input signal into a first signal and a second signal, wherein said input signal is a digital signal comprising an in-phase component I and a quadrature component Q, and wherein said second signal comprises an in-phase FM component IC and a quadrature-phase FM component QC, wherein said envelope extractor comprises one or more lookup tables, wherein each of said lookup tables comprises a plurality of cells arranged as a plurality of rows and a plurality of columns, wherein said rows and columns are addressed by a plurality of bits from said input signal, wherein each cell of said one or more lookup tables comprises a first data field containing data related to said first signal, a second data field containing data related to said in-phase FM component IC, and a third data field containing data relating to said quadrature-phase FM component QC, said second signal having an envelope amplitude maximum and an envelope amplitude minimum;

a first signal processor configured to modify said first signal to produce a first modified signal, said first signal processor having a first propagation delay;

a second signal processor configured to modify said second signal to produce a second modified signal, said second signal processor having a second propagation delay; and an envelope combiner configured to combine said first modified signal and said second modified signal to produce an output signal, said first propagation delay and said second propagation delay configured to reduce spectral regrowth of said output signal.

3. An envelope feedforward amplifier, comprising:

an envelope extractor configured to separate an input signal into a first signal and a second signal, wherein said input signal is a digital signal comprising an in-phase component I and a quadrature component Q, and wherein said second signal comprises an in-phase FM component IC and a quadrature-phase FM component QC, wherein said envelope extractor comprises one or more lookup tables, wherein each of said lookup tables comprises a plurality of cells arranged as a plurality of rows and a plurality of columns, wherein said rows and columns are addressed by a plurality of bits from said input signal, wherein said one or more lookup tables comprise a first lookup table containing data related to said first signal, a second lookup table containing data related to said in-phase FM component IC, and a third lookup table containing data relating to said quadrature-phase FM component QC, said second signal having an envelope amplitude maximum and an envelope amplitude minimum;

a first signal processor configured to modify said first signal to produce a first modified signal, said first signal processor having a first propagation delay;

a second signal processor configured to modify said second signal to produce a second modified signal, said second signal processor having a second propagation delay; and an envelope combiner configured to combine said first modified signal and said second modified signal to produce an output signal, said first propagation delay and said second propagation delay configured to reduce spectral regrowth of said output signal.

4. The envelope feedforward amplifier of claim 3, wherein said in-phase FM component IC comprises one or more bits of data from said in-phase component I.

5. The envelope feedforward amplifier of claim 3, wherein said quadrature-phase FM component QC comprises one or more bits of data from said quadrature-phase component Q.

6. A method, comprising the steps of:

separating an input signal into a first signal and a second signal, said second signal having an envelope amplitude maximum and an envelope amplitude minimum;

modifying said first signal to produce a first modified signal, said first modified signal being delayed by a first propagation delay;

modifying said second signal to produce a second modified signal, said second modified signal being delayed by a second propagation delay;

combining said first modified signal and said second modified signal to produce an output signal; and adjusting the lesser of said first propagation delay and said second propagation delay to reduce spectral regrowth of said output signal.

7. The method of claim 6, wherein said envelope amplitude minimum is approximately equal to said envelope amplitude maximum.

8. The method of claim 6, wherein said envelope amplitude minimum is not less than 75% of said envelope amplitude maximum.

9. The method of claim 6, wherein said first propagation delay is approximately equal to said second propagation delay.

10. The method of claim 6, wherein an absolute value of a difference between said first propagation delay and said second propagation delay is less than one microsecond.

11. The method of claim 6, wherein an absolute value of a difference between said first propagation delay and said second propagation delay is less than one tenth of a time bandwidth of said input signal.

12. The method of claim 6, wherein said step of adjusting comprises increasing said lesser of said first propagation delay and said second propagation delay.

13. The method of claim 6, wherein said step of modifying said first signal comprises amplifying said first signal.

14. The method of claim 6, wherein said step of modifying said second signal comprises amplifying said second signal.

15. The method of claim 6, wherein said step of modifying said second signal comprises up-converting said second signal to a higher frequency band.

16. The method of claim 6, wherein said step of combining comprises amplitude modulating said second modified signal.

17. The envelope feedforward amplifier of claim 16, wherein said second modified signal is modulated by said first modified signal.

18. The method of claim 6, wherein said step of combining comprises mixing said first modified signal and said second modified signal.

19. The method of claim 6, wherein said step of combining comprises using said first modified signal to adjust a bias of an amplifier that amplifies said second modified signal.

20. The method of claim 6, wherein said step of combining comprises using a substantially linear $g_m$ characteristic of a dual-gate FET to provide linear gain adjustment by controlling a voltage applied to a first gate of said dual-gate FET.

21. The method of claim 6, wherein said step of combining comprises adjusting a gain of an amplifier.

22. A method, comprising the steps of:
   separating an input signal into a first signal and a second signal, said second signal having an envelope with a relatively low amplitude region and a relatively high amplitude region;
   modifying said first signal to produce a first modified signal, said first modified signal being delayed by a first propagation delay;
   modifying said second signal to produce a second modified signal, said second modified signal being delayed by a second propagation delay;
   combining said first modified signal and said second modified signal to produce an output signal; and
   adjusting the lesser of said first propagation delay and said second propagation delay to reduce spectral regrowth in said output signal as compared to said input signal.

23. The method of claim 22, wherein said envelope in said relatively high amplitude region approximately equal to said envelope in said relatively low amplitude region.

24. The method of claim 22, wherein said envelope in said relatively low amplitude region is not less than 75% of said envelope in said relatively high amplitude region.

25. The method of claim 22, wherein said first propagation delay is approximately equal to said second propagation delay.

26. The method of claim 22, wherein an absolute value of a difference between said first propagation delay and said second propagation delay is less than one microsecond.

27. The method of claim 22, wherein an absolute value of a difference between said first propagation delay and said second propagation delay is less than one tenth of a time bandwidth of said input signal.

28. The method of claim 22, wherein said step of adjusting comprises increasing said lesser of said first propagation delay and said second propagation delay.

29. The method of claim 22, wherein said step of modifying said first signal comprises amplifying said first signal.

30. The method of claim 22, wherein said step of modifying said second signal comprises amplifying said second signal.

31. The method of claim 22, wherein said step of modifying said second signal comprises up-converting said second signal to a higher frequency band.

32. The method of claim 22, wherein said step of combining comprises amplitude modulating said second modified signal.

33. The envelope method of claim 32, wherein said second modified signal is modulated by said first modified signal.

34. The method of claim 22, wherein said step of combining comprises mixing said first modified signal and said second modified signal.

35. The method of claim 22, wherein said step of combining comprises using said first modified signal to adjust a bias of an amplifier that amplifies said second modified signal.

36. The method of claim 22, wherein said step of combining comprises using a substantially linear $g_m$ characteristic of a dual-gate FET to provide linear gain adjustment by controlling a voltage applied to a first gate of said dual-gate FET.

37. The method of claim 22, wherein said step of combining comprises adjusting a gain of an amplifier.

* * * * *